(12) United States Patent
Nealey et al.

(10) Patent No.: US 8,168,284 B2
(45) Date of Patent: May 1, 2012

(54) FABRICATION OF COMPLEX THREE-DIMENSIONAL STRUCTURES BASED ON DIRECTED ASSEMBLY OF SELF-ASSEMBLING MATERIALS ON ACTIVATED TWO-DIMENSIONAL TEMPLATES

(75) Inventors: Paul Franklin Nealey, Madison, WI (US); Mark Petar Stoykovich, Dover, NH (US); Konstantinos C. Daoulas, Goettingen (DE); Marcus Muller, Goettingen (DE); Juan J. de Pablo, Madison, WI (US); SangMin Park, Madison, WI (US)

(73) Assignee: Wisconsin Alumni Research Foundation, Madison, WA (US)

( * ) Notice: Subject to any disclaimer, the term of this patent is extended or adjusted under 35 U.S.C. 154(b) by 1224 days.

(21) Appl. No.: 11/545,060

(22) Filed: Oct. 5, 2006

(65) Prior Publication Data
US 2009/0087653 A1 Apr. 2, 2009

Related U.S. Application Data

(60) Provisional application No. 60/724,554, filed on Oct. 6, 2005, provisional application No. 60/761,863, filed on Jan. 24, 2006.

(51) Int. Cl.
B32B 3/24 (2006.01)
B05D 5/00 (2006.01)
(52) U.S. Cl. ............... 428/137; 428/138; 427/256
(58) Field of Classification Search ............ 428/137, 428/138; 427/256
See application file for complete search history.

(56) References Cited

U.S. PATENT DOCUMENTS

| | | | |
|---|---|---|---|
| 3,444,732 A | 5/1969 | McKinley et al. | |
| 5,948,470 A | 9/1999 | Harrison | |
| 6,746,825 B2 | 6/2004 | Nealey et al. | |
| 6,893,705 B2 * | 5/2005 | Thomas et al. | 428/141 |
| 6,926,953 B2 | 8/2005 | Nealey et al. | |
| 2003/0091752 A1 | 5/2003 | Nealey et al. | |
| 2003/0091865 A1 | 5/2003 | Chen et al. | |
| 2004/0143063 A1 * | 7/2004 | Chen et al. | 525/131 |
| 2006/0134556 A1 | 6/2006 | Nealey et al. | |
| 2008/0299353 A1 | 12/2008 | Stoykovich et al. | |

(Continued)

FOREIGN PATENT DOCUMENTS

JP 2007125699 A 5/2007

(Continued)

OTHER PUBLICATIONS

U.S. Appl. No. 11/580,694, filed Oct. 12, 2006, Nealey et al.

(Continued)

Primary Examiner — William P Watkins, III
(74) Attorney, Agent, or Firm — Weaver Austin Villeneuve & Sampson LLP

(57) ABSTRACT

Methods of fabricating complex three-dimensional structures on patterned substrates and related compositions are provided. The methods involve depositing on the substrate a block copolymer material that is "mismatched" to the substrate pattern, and then ordering the material to form a complex three-dimensional structure. According to various embodiments, the copolymer material mismatches the substrate pattern in that the symmetry and/or length scale of its bulk morphology differs from that of the pattern. When ordered, a balance between the physics that determines the bulk block copolymer morphology and the physics that determines the substrate surface interfacial interactions results in a thermodynamically stable complex three-dimensional film that varies in a direction perpendicular to the substrate and has a morphology that differs from its bulk morphology.

18 Claims, 20 Drawing Sheets

U.S. PATENT DOCUMENTS

| | | | |
|---|---|---|---|
| 2009/0087653 A1 | 4/2009 | Nealey et al. | |
| 2009/0087664 A1 | 4/2009 | Nealey et al. | |
| 2009/0196488 A1 | 8/2009 | Nealey et al. | |
| 2009/0260750 A1 | 10/2009 | Nealey et al. | |

FOREIGN PATENT DOCUMENTS

| | | |
|---|---|---|
| JP | 2007/138052 A | 6/2007 |
| JP | 2007/313568 A | 12/2007 |
| WO | WO2006112887 | 6/2006 |
| WO | 2007/111215 A | 10/2007 |
| WO | 2009/146086 | 3/2010 |

OTHER PUBLICATIONS

U.S. Appl. No. 11/879,758, filed Feb. 17, 2007, Nealey et al.
International Search Report dated May 2, 2007 issued in WO2006112887.
Written Opinion dated May 2, 2007 issued in WO2006112887.
Preliminary Examination Report dated May 30, 2007 issued in WO2006112887.
Asakawa et al. (2002) Nanopatterning with Microdomains of Block Copolymers using Reactive-Ion Etching Selectivity, *Jpn. J. Appl. Phys.* vol. 41 (2002) pp. 6112-6118.
Bates et al. (1990) Block Copolymer Thermodynamics: Theory and Experiment, *Annu.Rev.Phys. Chem.*, 1990, 41: pp. 525-557.
Bates et al. (1997) Polymeric Bicontinuous Microemulsions, *Phy Rev Ltrs*, vol. 69, No. 5, Aug. 4, 1997.
Bates et al. (1995) Isotropic Lifshitz Behavior in Block Copolymer-Homopolymer Blends, *Phy Rev Ltrs*, vol. 75, No. 24, Dec. 11, 1995.
Berreman et al. (1990) Use of trilevel resists for high-resolution soft-x-ray projection lithography, *Appl. Phys Lett.* 56 (22), May 28, 1990, p. 2180.
Black et al. (2001) Integration of self-assembled diblock copolymers for semiconductor capacitor fabrication, *Applied Physics Letters*, vol. 79, No. 3, Jul. 16, 2001, pp. 409-411.
Black et al. (2004) High-Capacity, Self-Assembled Metal-Oxide-Semiconductor Decoupling Capacitors, *IEEE Electron Device Ltrs*, vol. 25, No. 9, Sep. 2004.
Boltau et al. (1998) Surface-induced structure formation of polymer blends on patterned substrates, *Nature*, vol. 391, Feb, 1998, p. 877.
Broseta et al. (1990) Phase equilibria in copolymer/homopolymer ternary blends: Molecular weight effects, *J. Chem. Phy.*, 93(4), Aug. 15, 1990.
Burgaz et al. (2000) T-Junction Grain Boundaries in Block Copolymer-Homopolymer Blends, *Macromolecules*, vol. 33, pp. 8739-8745.
Campbell et al. (2000) Fabrication of photonic crystals for the visible spectrum by holographic lithography, Nature, vol. 404, Mar. 2, 2000, p. 53.
Cardinale et al. (1999) Demonstration of pattern transfer into sub-100 nm polysilicon line/space features patterned with extreme ultraviolet lithography, *J Va. Sci. Technol.B* vol. 17(6), Nov./Dec. 1999.
Chan et al. (1999) Ordered Bicontinuous Nanoporous and Nanorelief Cermamic Films from Self Assembling Polymer Precursors, *Science*, 286, 1716 (1999); DOI: 10.1126/science.386.5445.1716.
Chen et al. (1998) Morphology of thin block copolymer films on chemically patterned substrates, Journal of Chemical Physics, Apr. 22, 1998, vol. 108, No. 16, p. 6897.
Cheng et al (2001) Formation of a Cobalt Magnetic Dot Array viz Block Copolymer Lithography, *Adv Mater 2001*, 13, No. 15 Aug. 3, 2001, p. 1174.
Cheng et al. (2002) Fabrication of nanostructures with long-range order using block copolymer lithography, *Applied Physics Letters*, vol. 81, No. 19, Nov. 4, 2002, p. 3657.
Cheng et al. (2003) Templated Self-Assembly of Block Copolymers: Effect of Substrate Topography, *Advanced Materials* 2003, vol. 15, No. 19, Oct. 2, pp. 1599-1602.
Cheng et al.(2001) Formation of a Cobalt Magnetic Dot array via Block Copolymer Lithography, *Advanced Materials*, 2001, vol. 13, No. 15, Aug. 3, pp. 1174-1178.

Corvazier et al. (2001) Lamellar phases and microemulsions in model ternary blends containing amphiphilic block copolymers, The Royal Society of Chemistry, J. Mater. Chem, 2001, 11, pp. 2864-2874.
Coulon et al. (1989) Surface-Induced Orientation of Symmetric, Diblock Copolymers: A Secondary Ion Mass Spectrometry Study, *Macromolecules*, vol. 22, pp. 2581-2589.
Coulon et al. (1993) Time Evolution of the Free Surface of Ultrathin Copolymer Films, Macromolecules, vol. 26, pp. 1582-1589.
Daoulas et al. (2006) Fabrication of Complex Three-Dimensional Nanostructures from Self-Assembling Block Copolymer Matrials on Two-Dimensional Chemically Patterned Templates with Mismatched Symmetry, *Physical Review Letters*, Jan. 27, 2006, PRL 96, 036104.
Daoulas et al. (2006) Morphology of multi-component polymer systems: single chain in mean field simulation studies, *The Royal Society of Chemistry, Soft Matter*, 2006, vol. 2, pp. 573-583.
Düchs et al. (2003) Fluctuation Effects in Ternary AB + A + B Polymeric Emulsions, Macromolecules V36, pp. 9237-9248.
Düchs et al. (2004) Formation and structure of the microemulsion phase in two-dimensional ternary AB+A+B Polymeric emulsions, Jnl of Chem Phy, vol. 121, No. 6, Aug. 8, 2004, p. 2798.
Edwards et al. (2004) Precise Control over Molecular Dimensions of Block-Copolymer Domains Using the Interfacial Energy of Chemically Nanopatterned Substrates, *Advanced Materials*,2004, vol. 16, No. 15, Aug. 4, pp. 1315-1319.
Fasolka et al. (2000) Morphology of Ultrathin Supported Diblock Copolymer Films: Theory and Experiment, *Macromolecules* vol. 33, pp. 5702-5712.
Floudas et al. (1997) Microphase separation in block copolymer/homopolymer blends: Theory and experiment, *J. Chem. Phys.* 106 (8), Fe. 22, 1997, p. 3318.
Fukukawa et al. (2005) Synthesis and Characterization of Silicon-Containing Block Copolymers from Nitroside-Mediated Living Free Radical Polymerization, Macromolecules vol. 38, pp. 263-270.
Helfand et al. (1972) Theory of the Interface between Immiscible Polymers,II, Journal of Chemical Physics, vol. 56, No. 7, Apr. 1, 1972.
Hillmyer et al. (1991) Model Bicontinuous Microemulsions in Ternary Homopolymer/Block Copolymer Blends, J. Phy. Chem. B 1999, 103, pp. 4814-4824.
Huang et al. (1991) Modeling Copolymer Adsorption on Laterally Heterogeneous Surfaces, Physical Review Letters, Feb. 4, 1991, vol. 66, No. 5, p. 620.
Jeong et al. (2002) Asymmetric Block Copolymers with Homopolymers: Routes to Multiple Length Scale nanostructures, Adv. Mater 2002.,14, No. 4, Feb. 19, 2002, p. 274.
Jeong et al. (2003) Precise Control of Nanopore Size in Thin Film Using Mixtures of Asymmetric Block Copolymer and Homopolymer, Macromolecules 2003, 36, pp. 10126-10129.
Kim et al. (2000) Chemical Modification of Self-Assembled Monolayers by Exposure to Soft X-rays in Air, J. Phys. Chem., vol. 104, No. 31, 2000, pp. 7403-7410.
Kim et al. (2003) Epitaxial self-assembly of block copolymers on lithographically defined nanopatterned substrates, Nature, vol. 424, Jul. 24, 2003, Nature Publishing Group, p. 411.
Krishnan et al. (2001) Shear-Induced Nano-Macro Structural Transition in a Polymeric Bicontinuous Microemulsion, Phy Rev Ltrs, vol. 87, No. 9, Aug. 27, 2001, p. 098301-1.
Li et al. (2000) Dense arrays of ordered GaAs nanostructures by selective area growth on substrates patterned by block copolymer lithography, Applied Physics Letters, vol. 76, No. 13, Mar. 27, 2000, pp. 1689-1691.
Mansky et al. (1997) Ordered Diblock Copolymer Films on Random Copolymer Brushes, Macromolecules 1997, 30, pp. 6810-6813.
Mansky et al. (2006) Controlling Polymer-Surface Interactions with Random Copolymer Brushes, http://www.jstor.org/, Wed. Aug. 16, 2006.
Messe et al. (2003) Effect of the Molecular weight of the homopolymers on the morphology in ternary blends of polystyrene, polyisoprene, polystyrene-block-polyisoprene copolymer, Polymer, 44 (2003) pp. 7397-7403.

Morkved et al. (1999) Dynamics of ternary polymer blends: Disordered, ordered and bicontinouous microemulsion phases, Faraday Discuss.,1999, 112, pp. 335-350.

Morkved et al. (2001) Static and Dynamic Scattering from Ternary Polymer Blends: Bicontinuous Microemulsions, Lifshitz lines, and amphiphilicity, *Jnl of Chem Phy*, V.114, No. 16, Apr. 22, 2001, p. 7247.

Mortensen et al. (2000) Ternary mixture of homopolymer blend and diblock copolymer studied near the Lifshitz composition by small-angle neutron scattering, J. Appl. Cryst., 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, *Jnl of Polymer Science: Part B: Polymer Physics*, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, *IEEE Trans.on Magnetics*, vol. 38, No. 5, Sep. 2002, p. 1949.

Orso et al. (1999) Phase Behavior of Thin Film Blends of Block Copolymers and Homopolymers: Changes in Domain Dimensions, *Macromolecules*, 32, pp. 1087-1092.

Park et al. (1997) Block Copolymer Lithography: Periodic Arrays of~$10^{11}$ Holes in 1 Square Centimeter, *Science*, vol. 276, May 30, 1997, pp. 1401-1404.

Park et al. (2003) Enabling nanotechnology with self assembled block copolymer patterns, *Polymer*, vol. 44 (2003) pp. 6725-6760; www.sciencedirect.com.

Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, *Langmuir*, vol. 16, No. 10, 2000, pp. 4625-4631.

Rockford et al. (1999) Polymers on Nanoperiodic, Heterogeneous Surfaces, *Phy. Rev. Ltrs, The American Physical Society*, vol. 82, No. 12, p. 2602.

Russell et al. (1989) Characteristics of the Surface-Induced Orientation for Symmetric Diblock PS/PMMA Copolymers, *Macromolecules*, vol. 22, pp. 4600-4606.

Schattenburg et al. (1995) Optically matched trilevel resist process for nanostructure fabrication, *J. Vac. Sci Technol. B*, 15(6), Nov./Dec. 1995, p. 3007.

Schwahn et al. (1999) Crossover from 3D Ising to Isotropic Lifshitz Critical Behavior in a Misture of a Homopolymer Blend and Diblock Copolymer, *Phy. Rev. Ltrs, The American Physical Society*, vol. 82, No. 25, Jun. 21, 1999, p. 5056.

Schwahn et al. (2000) Thermal Composition fluctuations near the isotropic Lifshitz critical point in a ernary mixture of a homopolymer blend and diblock copolymer, *Jnl. Chem. Phy.*, vol. 112 , No. 12, Mar. 22, 2000, p. 5454.

Solak, Harun H. (2006) Nanolithography with coherent extreme ultraviolet light, *Jnl. of Physics D: App. Phys*,39 (2006) R171-R188.

Stoykovich et al. (2005) Directed Assembly of Block Copolymer Blends into Nonregular Device-Oriented Structures, *Science*, vol. 308, Jun. 3, 2005, www.sciencemag.org, p. 1442.

Stoykovich et al. (2006) Block Copolymers and Conventional Lithogrphy, *Materialstoday*, vol. 9, No. 9, Sep. 2006, p. 20.

Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).

Teubner et al. (1987) Origin of the Scattering Peak in Microemulsions, *J. Chem. Phys.*, 87(5), Sep. 1, 1997, p. 3195.

Thurn-Albrecht et al. (2000) Nanoscopic Templates from Oriented Block Copolymer Films, Communications, *Advanced Materiels*, vol. 12, No. 11, pp. 787-791.

Thurn-Albrecht et al. (2000) Ultrahigh-Density Nanowire Arrays Grown in Self-Assembled Diblock Copolymer Templates, *Science*, Dec. 15, 2000, vol. 290, pp. 2126-2129.

Torikai et al. (1997) Lamellar Domain Spacings of Diblock Copolymer/Homopolymer Blends and Conformations of Block Chains in Their Microdomains, *Macromolecules*, 30, pp. 5698-5703.

Urbas et al. (2000) Tunable Block Copolymer/Homopolymer Photonic Crystals, *Advanced Materials*, vol. 12, No. 11 p. 812.

Urbas et al. (2002) Bicontinuous Cubic Block Copolymer Photonic Crystals, *Advanced Materials*, vol. 14, No. 24, Dec. 17, 2002, p. 1850.

Wang et al. (2000) Symmetric diblock copolymer thin films confined between homogeneous and patterned surfaces: Simulations and theory, *Journal of Chemical Physics*, vol. 112, No. 22, Jun. 8, 2000, pp. 9996-10010.

Whitesides et al. (1991) Molecular self-Assembly and Nanochemistry: A Chemical Strategy for the Synthesis of Nanostructures, *Articles, Science* vol. 254, p. 1312, Nov. 29, 1991.

Whitesides et al. (2002) Self-Assembly at All Scales, *Science, AAAS*, 295, p. 2418.

Xu et al. (2001) The Influence of molecular weight on nanoporous polymer films, *Polymer*, 42 (2001) pp. 9091-9095; www.elsevier.com/locate/polymer.

Yang et al. (2000) Guided Self-Assembly of Symetric Diblock Copolymer Films on Chemically Nanopatterned Substrates, *Macromolecules* 2000, 33, pp. 9575-9582.

Nealey, Paul Franklin, et al., "Density Multiplication and Improved Lithography By Directed Block Copolymer Assembly," U.S. Appl. No. 12/329,484, filed Dec. 5, 2008.

International Search Report and Written Opinion of the International Searching Authority mailed Aug. 24, 2009, Application No. PCT/US 2008/085742, 14 pages.

Park, C., et al., "Enabling Nanotechnology with Self Assembled Block Copolymer Patterns," *Polymer*, Elsevier Science, Publishers B.V., GB, vol. 44, No. 22, Oct. 1, 2003, pp. 6725-6760.

Black, C.T., et al, "Polymer Self Assembly in Semiconductor Microelectronics," IBM Journal of Research and Development, International Business Machines Corporation, NewYork, vol. 51, No. 5, Sep. 1, 2007, XP007905680, pp. 605-633.

Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/AIP, Melville, New York, vol. 25, No. 6, Dec. 6, 2007, pp. 1958-1962.

Stoykovich, M.P., et al, "Block Copolymers and Conventional Lithography," *Materials today*, Elsevier Science, Kidlington, GB, vol. 9, No. 9, Sep. 1, 2006, pp. 20-29.

Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.

Nealey, Paul Franklin, et al., "Methods and Compositions for Forming a Periodic Patterned Copolymer Films," U.S. Appl. No. 11/286,260, filed Nov. 22, 2005.

U.S. Office Action mailed Jul. 31, 2009, from U.S. Appl. No. 11/286,260.

U.S. Office Action mailed Jan. 25, 2010, from U.S. Appl. No. 11/286,260.

Nealey, Paul Franklin, "Directed Assembly Of Triblock Copolymers," U.S. Appl. No. 11/580,694, filed Oct. 12, 2006.

U.S. Office Action mailed Dec. 2, 2009, from U.S. Appl. No. 11/580,694.

Stoykovich, Mark P., et al., "Methods and Compositions For Forming Patterns With Isolated Or Discrete Features Using Block Copolymer Materials," U.S. Appl. No. 11/879,758, filed Jul. 17, 2007.

U.S. Office Action mailed Jul. 23, 2009, from U.S. Appl. No. 11/545,060.

Bates, et al., "Block Copolymers—Designer Soft Materials," *Physics Today*, Feb. 1999, 7 pages.

Bohbot-Raviv, et al., "Discovering New Ordered Phases of Block Copolymers," The *American Physical Society*, vol. 85, No. 16, Oct. 16, 2000, 4 pages.

Ruiz, et al., "Density Multiplication and Improved Lithography by Directed block Copolymer Assembly," *Science*, vol. 321, Aug. 15, 2008, pp. 936-939.

Son, et al., "Placement Control of Nanomaterial Arrays on the Surface-Reconstructed Block Copolymer Thin Films," *ACSNano*, vol. 3, No. 12, 2009, pp. 3927-3934.

Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.

Galatsis, K., et al., Patterning and Templating for Nanoelectronics., *Advanced Materials*, 2010, vol. 22, pp. 769-778.

Hong, A., et al., "Metal Nanodot Memory by Self-Assembled Block Copolymer Lift-Off," *American Chemical Society*, Nano Left 2010, vol. 10, pp. 224-229.

Ji, Shengxiang, et al., "Molecular Transfer Printing Using Block Copolymers," *ACSNano* vol. 4, No. 2, 2010, pp. 599-609.

Stoykovich, M.P., et al, "Remediation of Line Edge Roughness in Chemical Nanopatterns by the Directed Assembly of Overlying Block Copolymer Films," Macromolecules, *American Chemical Society*, vol. 43, Feb. 10, 2010, pp. 2334-2342.

Suh, Hyo Seon, et al., "Orientation of Block Copolymer Resists on Interlayer Dielectrics with Tunable Surface Energy," *American Chemical Society*, vol. 43, Nov. 13, 2009, pp. 461-466.

Kim, et al., "Synthesis of Photacid Generator-Containing Patternable Diblock Copolymers by Reversible Addition—Fragmentation Transfer Polmerization," Chemistry of Materials, *American Chemical Society*, Jul. 6, 2009, pp. 3030-3032.

Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.

Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.

Park, et al., "Selective Growth and Characterization of InGaAs Quantum Dots on Patterned InP Substrates Utilizing A Diblock Copolymer Template," *IEEE* 978-4244-3433-6/09, copyright 2009, pp. 52-54.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.

Hirai, et al., "One-Step Direct-Patterning Template Utilizing Self-Assembly of POSS-Containing Block Copolymers," *Adv. Mater*, 2009, vol. 21, pp. 4334-4338.

Kang, et al., "Control of the Critical Dimensions and Line Edge Roughness With Pre-Organized Block Copolymer Pixelated photoresists," *J. Vac. Sci. Technol.*, vol. 27, No. 6, Nov./Dec. 2009, pp. 2993-2997.

Detcheverry, et al., Monte Carlo Simulation of Coarse Grain Polymeric Systems, *The American Physical Society*, May 15, 2009, PRL 102(19) 197801(4), pp. 197801-1-197801-4.

Pike, et al., "Theoretically Informed Coarse Grain Simulations of Polymeric Systems," *The Journal of Chemical Physics*, Published Aug. 27, 2009, vol. 131, pp. 084903-1 to 084903-10.

Ting, et al., "Plasma Etch Removal of Poly (methyl methacrylate) in Block Copolymer Lithography," *J. Vac. Sci. Technol.*, vol. 26(5), Sep./Oct. 2008, pp. 1684-1689.

Welander, et al., "Rapid Directed Assembly of Block Copolymer Films at Elevated Temperatures," *American Chemical Society*, Macromolecules, vol. 41, Published Apr. 1, 2008, pp. 2759-2761.

Welander, et al., "Impact of Trench Width Roughness on the Graphoepitaxial Assembly of Block Copolymers," *J. Vac Sci. Technol.*, vol. 26(6), Nov./Dec. 2008, pp. 2484-2489.

Stuen, et al., In situ Characterization of Block Copolymer Ordering on Chemically Nanopatterned Surfaces by time-resolved small angle X-ray Scattering, *J. Vac. Sci. Technol.* vol. 26(6), published Dec. 1, 2008, pp. 2504-2508.

Park, et al., "Characterization of Cylinder-Forming Block Copolymers Directed to Assemble on Spotted Chemical Patterns," *American Chemical Society*, Macromolecules, Published Nov. 4, 2008, vol. 41, pp. 9118-9123.

Son, et al., "Surfactant-Assisted Orientation of Thin Diblock Copolyer films," *Advanced Materials*, 2008, vol. 20, pp. 3643-3648.

Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.

Ji, et al., "Generalization of the Use of Random Copolymers to Control the Wetting Behavior of Block Copolymer Films," *American Chemical Society*, published Nov. 11, 2008, vol. 41, pp. 9098-9103.

Ji, et al., "Preparation of Neutral Wetting Brushes for Block Copolymer Films from Homopolymer Blends," *Advanced Materials*, 2008 vol. 20, pp. 3054-3060.

Kang, et al., "Hierarchical Assembly of Nanoparticle Superstructures from Block Copolymer-Nanoparticle Composites," published Apr. 9, 2008, vol. 100(4), pp. 148303-1-148303-4.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Detcheverry, et al., Monte Carlo Simulations of a Course Grain Model for Block Copolymers and Nanocompositcs, published Jun. 11, 2008, vol. 41, pp. 4989-5001.

Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Ekinci, et al., "20 nm Line/Space Patterns in HSQ Fabricated by EUV Interference Lithography," *Photon Lithography*, MNE 2006 Micro- and Nano-Engineering, 2 pages.

In, et al., Side-Chain-Grafted Random Copolymer Brushes as Neutral Surfaces for Controlling the Orientation of Block Copolymer Microdomains in Thin Films, *American Chemical Society*, Langmuir, published Aug. 1, 2006, vol. 22, pp. 7855-7860.

Craig, et al., "Self Assembly of Block Copolymers on Lithographically Defined Nano Patterned Substrate," *Journal of Photopolymer Science & Technology*, vol. 20, No. 4, Jun. 4, 2007, 7 pages.

Kim, et al., "Defect Structure in Thin Films of a Lamellar Block Copolymer Self-Assemble on Neutral Homogeneous and Chemically Nanopatterned Surfaces," *American Chemical Society*, Macromolecules, published Jul. 13, 2006, vol. 39, 5466-5470.

Edwards, et al., "Long-Range Order and Orientation of Cylinder-Forming Block Copolymers on Chemically Nanopatterned Striped Surfaces," *American Chemical Society*, Macromolecules, published Apr. 13, 2006, vol. 39, pp. 3598-3607.

Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.

Xiao, et al., "Graphoepitaxy of Cylinder-forming Block Copolymers for Use as Templates to Pattern Magnetic Metal Dot Arrays," *Institute of Physics Publishing*, Nanotechnology, vol. 16, 2005, pp. S324-S329.

La, et al., "Directed Assembly of Cylinder-Forming Block Copolymer Films and Thcrmochcmically Induced Cylinder to Sphcrc Transition: A Hierarchical Routc to Linear Arrays of Nanodots," Nano Letter 2005, published May 28, 2005, *American Chemical Society*, vol. 5, No. 7, pp. 1379-1384.

Edwards, et al., "Mechanism and Kinetics of Ordering in Diblock Copolyer Thin Films on Chemically Nanopatterned Substrates," *Journal of Polymer Science*: Part B, Polymer Physics, 2005, vol. 43, pp. 3444-3459.

Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.

Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.

Solak, et al., "Sub-50 nm Period Patterns With EUV Interference Lithography," Microelectronic Engineering 67-68 (2003) 56-62.

Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.

Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.

Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.

Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.

Peters, et al., "Combining Advanced Lithographic Techniques and Self-Assembly of Thin Films of Diblock Copolymers to Produce Templates for Nanofabrication," *J. Vac. Sci. Technol.*, vol. 18(6), Nov./Dec. 2000, pp. 3530-3534.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Yang, et al., "Patterning of Self-Assembled Monolayers with Lateral Dimensions of 0.15 um Using Advanced Lithography," *J. Vac. Sci. Technol.*, vol. 17(6), Nov./Dec. 1999, pp. 3203-3207.

Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.

International Search Report and Written Opinion of the International Searching Authority mailed Dec. 16, 2009, Application No. PCT/US 2009/039208.

U.S. Final Office Action mailed Mar. 8, 2010, from U.S. Appl. No. 11/545,060.

Detcheverry, et al., "Theoretically Informed Coarse Grain Simulations of Block Copolymer Melts: Mehtod and Applications," Soft Matter 5 (24), 2008, 4868-4865.

Detcheverry, et al., "Theoretically Informed Coarse Grain Simulations of Polymeric Systems," Foraday Discussions 144, (2010) 111-125.

Edwards, et al., Binary Blends of diblock Copolymers as an Effective route to Multiple, Length Scales in Perfect Directed Self-Assembly of Diblock Copolymer Thin Films, J. Vac. Sci., Technol., vol. 24, No. 1, Jan./Feb. 2006, pp. 340-344.

Kang, et al., "Directed Assembly of Asymmetric Ternary Block Copolymer-Homopolymer Blends Using Symmetric Block Copolymer into Checkerboard Trimming Chemical Patterns," J. Vac. Sci. Technol., vol. 26, No. 5, Nov./Dec. 2008, pp. 2495-2499.

La, et al, "Directed Assembly of Cylinder-Forming Block Copolymers into Patterned Structures to Fabricate Arrays of Spherical Domains and Nanoparticles," Chemistry of Materials, 2007:19(18), pp. 4538-4544.

Nakano, et al., Single-Step Single-Molecure PCR of DNA with a Homo-Priming Sequence Using a Single Primer and Hot-Startable DNA Polymerase, Journal of Bioscience and Bioengineering, 2000, vol. 90 No. 4, pp. 456-458.

Park, et al., "Nano-Scale Selective Growth and Optical Characteristics of Quantum Dots on III-V Substrates Prepared by Diblock Copolymer Nano-Patterning," Journal of Nanophotonics 3 (1), 2009), 031604.

Nealey, Paul Franklin, et al., "Molecular Transfer Printing Using Block Copolymers," U.S. Appl. No. 12/416,816, filed Apr. 1, 2009.

U.S. Office Action mailed Jun. 25, 2010, from U.S. Appl. No. 11/286,260.

U.S. Final Office Action mailed Jun. 10, 2010, from U.S. Appl. No. 11/580,694.

Todo et al., "Domain-Boundary Structure of Styrene-Isoprene Block Copolymer Films Cast From Solutions .III. Preliminary-Results on Spherical Microdomains," *Polymer Engineering and Science*, 17 (8): 587-597 1977.

Morkved et al., "Local control of microdomain orientation in diblock copolymer thin films with electric fields," *Science*, 273 (5277): 931-933 Aug. 16, 1996.

Kim, SH, et al., "Highly oriented and ordered arrays from block copolymers via solvent evaporation," Advanced Materials, Feb. 3, 2004, 16 (3), pp. 226-231.

Fasolka, MJ, et al., Block copolymer thin films: Physics and applications, Annual Review of Materials Research, 2001, 31, pp. 323-355.

Tanaka, H, et al., "Ordered Structure in Mixtures of a Block Copolymer and Homopolymers . 1. Solubilization of Low-Molecular-Weight Homopolymers," Macromolecules, 24 (1), Jan. 7, 1991, pp. 240-251.

Hamley, et al., Nanostructure fabrication using block copolymers, *Nanotechnology*, Oct. 2003, 14 (10), pp. R39-R54.

Segalman, RA, et al., "Graphoepitaxy of spherical domain block copolymer films," Advanced Materials, Aug. 3, 2001, 13 (15) pp. 1152-1155.

Office Action mailed Oct. 7, 2010, for U.S. Appl. No. 12/416,816.

U.S. Final Office Action mailed Dec. 13, 2010, from U.S. Appl. No. 11/286,260.

U.S. Office Action mailed Dec. 17, 2010, from U.S. Appl. No. 11/545,060.

U.S. Office Action mailed Apr. 20, 2011 for U.S. Appl. No. 12/416,816.

U.S. Office Action mailed Apr. 21, 2011 for U.S. Appl. No. 12/329,484.

* cited by examiner

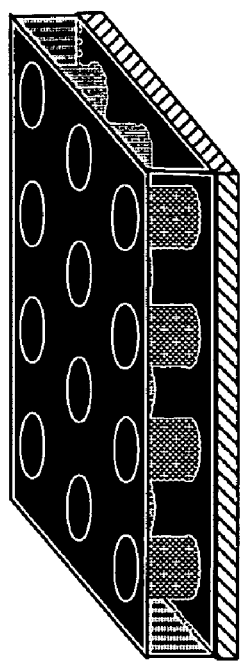
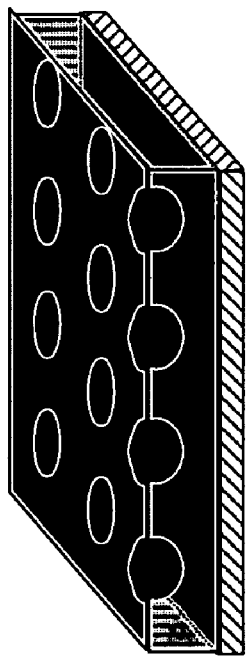
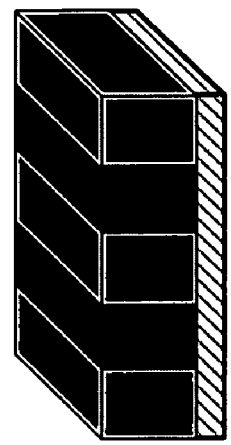
FIG. 2

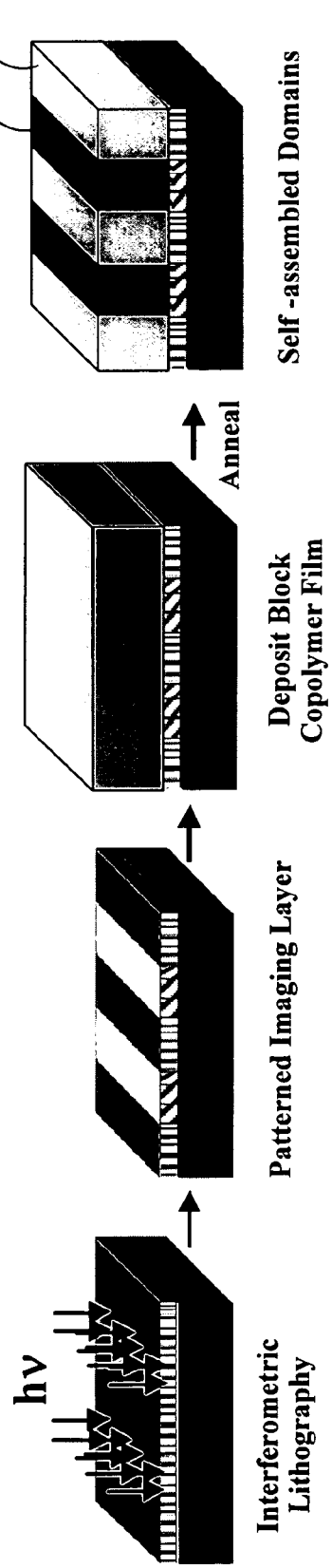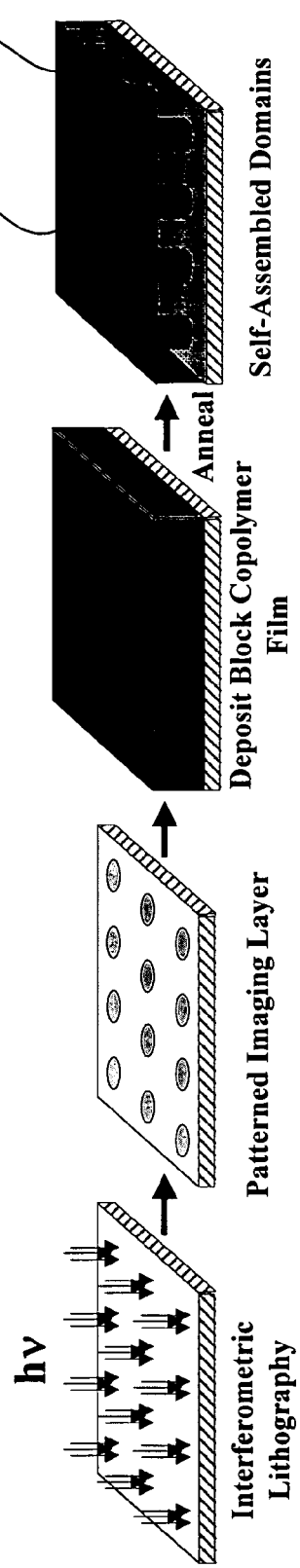
FIG. 3A Guided Self-Assembly of Lamellar Domains
FIG. 3B Guided Self-Assembly of Cylindrical Domains

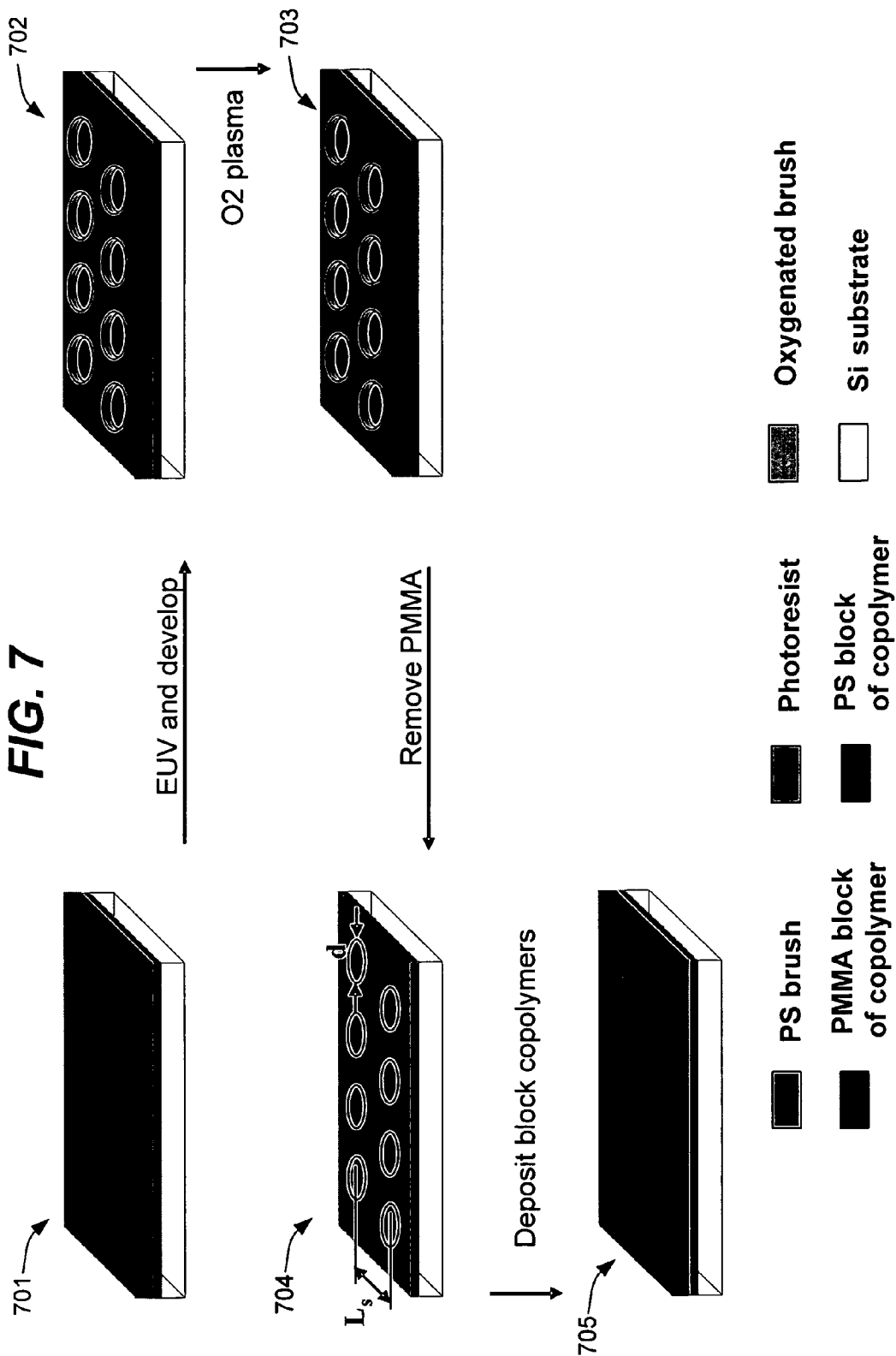

FABRICATION OF COMPLEX THREE-DIMENSIONAL STRUCTURES BASED ON DIRECTED ASSEMBLY OF SELF-ASSEMBLING MATERIALS ON ACTIVATED TWO-DIMENSIONAL TEMPLATES

CROSS-REFERENCE TO RELATED APPLICATIONS

This application claims priority under 35 USC §119(e) from U.S. Provisional Application No. 60/724,554, filed Oct. 6, 2005. This application also claims priority under 35 USC §119(e) from U.S. Provisional Application No. 60/761,863, filed Jan. 24, 2006. These applications are hereby incorporated by reference in their entireties and for all purposes.

STATEMENT OF GOVERNMENT SUPPORT

This invention was made with United States government support awarded by the following agency: NSF 0425880. The United States government has certain rights in this invention.

FIELD OF THE INVENTION

The invention relates to methods of nanofabrication techniques. More specifically, the invention relates to patterning materials at the nanoscale level utilizing block copolymers.

BACKGROUND OF THE INVENTION

As the development of nanoscale mechanical, electrical, chemical and biological devices and systems increases, new processes and materials are needed to fabricate nanoscale devices and components. This is especially true as the scale of these structures decreases into the tens of nanometers. Block copolymer materials are useful in nanofabrication because they self-assemble into distinct domains with dimensions in the tens of nanometers or lower.

However, existing methods of using block copolymer material suffer from several limitations. Approaches that rely solely on copolymer self-assembly suffer from defects in the patterns. One approach to nanopatterning with block copolymers combines chemical patterning of a substrate by advanced lithographic techniques with the self-assembly of diblock copolymers. The chemical pattern directs the self-assembly of the diblock copolymer, producing perfect or near-perfect duplication of the pattern and registration of the pattern features over a large area.

However, thus far the use of directed self-assembly has been limited to replicating the two-dimensional pattern of the substrate in the block copolymer film.

What is needed therefore are methods and compositions for creating block copolymer films with more complex morphologies.

SUMMARY OF THE INVENTION

The present invention meets these needs by providing methods of fabricating complex three-dimensional structures on patterned substrates, and related compositions. The methods involve depositing on the substrate a block copolymer material that is "mismatched" to the substrate pattern, and then ordering the material to form a complex three-dimensional structure. According to various embodiments the copolymer materials mismatches the substrate pattern in that the symmetry and/or length scale of its bulk morphology differs from that of the pattern. Mismatching the polymer morphology and the chemical patterns results in new and unique equilibrium structures. When ordered, a balance between the physics that determines the bulk block copolymer morphology and the physics that determines the substrate surface interfacial interactions results in a thermodynamically stable complex three-dimensional film that varies in a direction perpendicular to the substrate and has a morphology that differs from its bulk morphology.

One aspect of the invention relates to compositions of thin film copolymer structures that exhibit bicontinuous morphologies. The structures include a substrate and a copolymer film on the substrate. The film, which includes a microphase-separated block copolymer, exhibits bicontinuous morphology. At least one phase is registered with the underlying substrate. In certain embodiments, two or more phases are registered with the underlying substrate, e.g., both phases of a diblock copolymer are registered and addressable from the side of the film adjacent to the substrate. Both domains provide connectivity between the free surface of the film and the substrate. The block copolymer may also be a higher order block copolymer (e.g., a triblock copolymer) that has multiple continuous phases. In a specific embodiment, the film is a set of alternating perforated sheets. According to various embodiments, the film exhibits long-range order at the substrate.

Another aspect of the invention relates to compositions of thin film copolymer structures. The structures include a patterned substrate and a copolymer film including a microphase-separated block copolymer on the substrate. The film exhibits a morphology that is non-uniform in a direction perpendicular to the substrate and at least one phase that is registered with the underlying substrate. The film varies in the direction perpendicular to the substrate, rather than being grown vertically up from the substrate to replicate the substrate pattern. In certain embodiments, the film exhibits a first symmetry at the substrate and a second symmetry at the surface of the film, wherein the first and second symmetries differ.

Yet another aspect of the invention relates to thin film copolymer structures that include a patterned substrate and a thin film on the substrate, wherein the symmetry of the film morphology differs from the bulk symmetry of the copolymer material and the symmetry of the substrate pattern.

Also according to various embodiments, the films exhibit short-range order at distances away from the substrate, e.g., at the film surface and long-range order at the substrate. In certain embodiments, thin film structures include ordered elements (e.g., spheres) that do not correspond to the substrate pattern.

In certain embodiments, one or more phases of the films described herein are selectively functionalized. For example, in a particular embodiment where one of the blocks (e.g. polyacrylic acid) has a carboxylic functionality (COOH), metal ions are be selectively sequestered in the block and subsequently reduced to form metal or metal ioxide nanoparticles.

In certain embodiments, one or more phases of the films may be selectively removed. The remaining structures may be used for applications including etch masks, templates for selective deposition, templates for selective infusion, and nanoreactors, e.g., for creating nanoparticle or nanocluster arrays.

Another aspect of the invention relates to addressable arrays. In certain embodiments these arrays include a patterned substrate and a thin block copolymer film that has channels that on one side of the film are registered with the substrate and that are readily addressable.

A further aspect of the invention relates to methods of forming complex three-dimensional that involve providing a substrate patterned with activated regions; depositing a layer of material comprising a block copolymer on the substrate; and treating the copolymer material such that a microphase-separated film having a bi-continous morphology is formed, wherein at least one phase is registered with the underlying substrate.

Another aspect of the invention relates to method of forming thin film complex copolymer structures that involves providing a substrate patterned with activated regions; the pattern having a first symmetry; depositing a layer of material comprising a block copolymer, wherein the bulk morphology of the block copolymer has a second symmetry that differs from the first symmetry; and ordering the copolymer material to form a copolymer structure. At least one phase of the structure registered with the underlying substrate and the film is non-uniform in a direction perpendicular to the substrate.

The methods may also include selectively functionalizing one or more phases of the complex three-dimensional films.

These and other features of the invention are described further below with reference to the drawings.

BRIEF DESCRIPTION OF THE DRAWINGS

FIG. 2 shows spherical, cylindrical and lamellar ordered copolymer domains formed on substrates.

FIGS. 3A and 3B show methods of directing assembly of lamellar and cylindrical copolymer domains on substrates.

FIG. 7 is a basic illustration of an example of one procedure that may be used to pattern the substrate.

DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

According to various embodiments, the present invention provides methods of directing the assembly of diblock, triblock, and higher order copolymers of different compositions into a number of fabrication templates with complex architectures over areas as large as chips, throughout films that are thick enough to be considered (from a device manufacturing standpoint) three-dimensional, and precisely registered with the underlying substrate. In certain embodiments, assembly is directed by simple binary two-dimensional patterns in chemical functionality. The patterns may be lithographically defined. The block copolymer structures of the present invention exhibit complex three-dimensional morphologies. These morphologies are not exhibited by the copolymer material in the bulk, but are thermodynamically stable.

Figure 1:
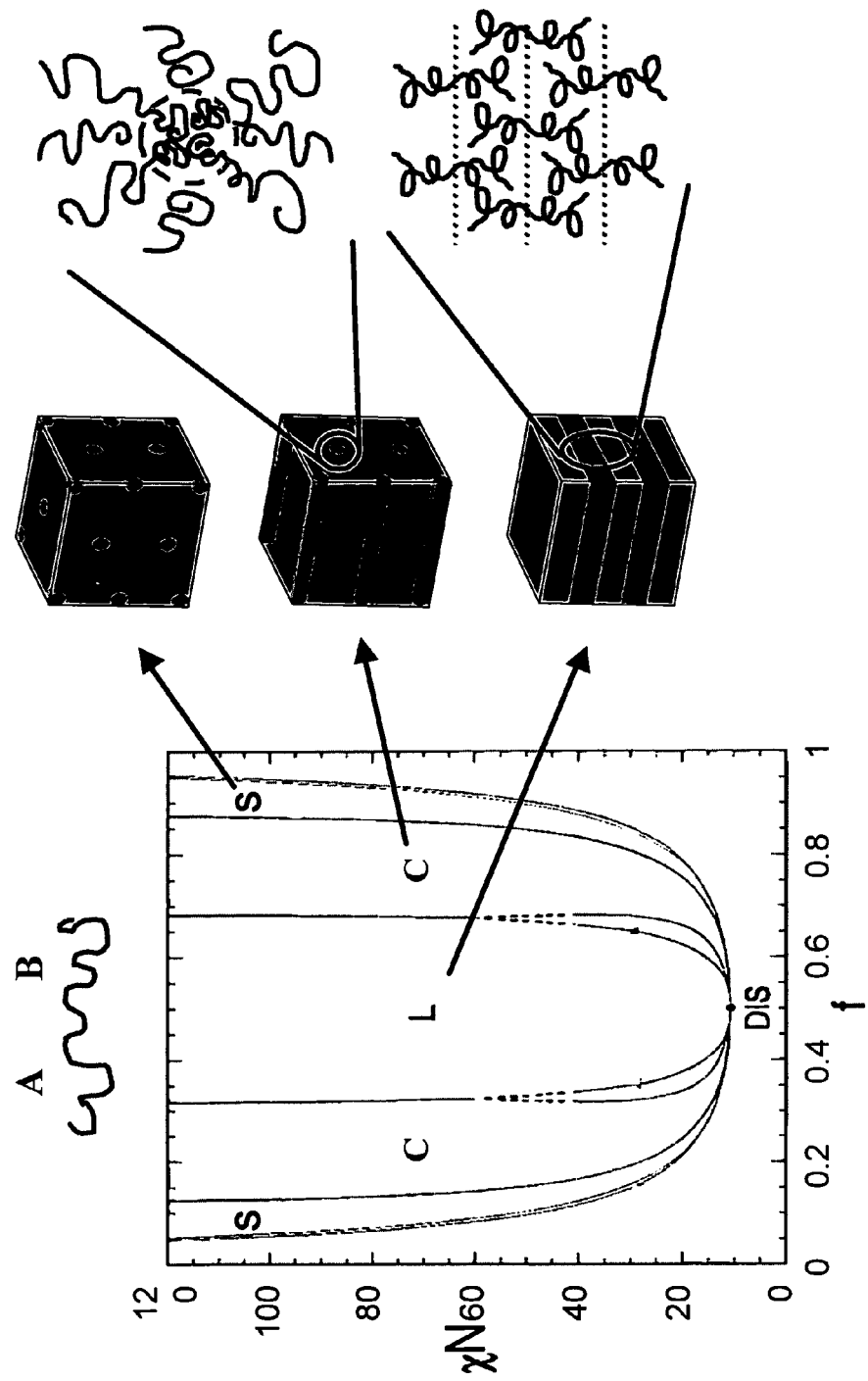
FIG. 1 shows ideal phase behavior of diblock copolymers.

Block copolymers are a class of polymers synthesized from two or more polymeric blocks. The structure of diblock copolymer AB may correspond, for example, to AAAAAAA-BBBBBBBB. FIG. 1 shows ideal phase behavior of diblock copolymers. The graph in FIG. 1 shows $\chi N$ (where $\chi$ is the Flory-Huggins interaction parameter and N is the degree of polymerization) as a function of the volume fraction, f, of a block (A) in a diblock (A-b-B) copolymer. $\chi N$ is related to the energy of mixing the blocks in a diblock copolymer and is inversely proportional to temperature. FIG. 1 shows that at a particular temperature and volume fraction of A, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 5-50 nm. FIG. 2 shows spherical, cylindrical and lamellar ordered domains formed on substrates. Domains (spheres, cylinders or lamellae) of one block of the copolymer are surrounded by the other block copolymer. As shown in FIG. 2, cylinders may form parallel or perpendicular to the substrate.

Although the FIGS. 1 and 2 show phase behavior of diblock copolymers for illustrative purposes, the phase behavior of block copolymers containing more than two types of blocks (e.g., A-b-B-b-C) also results in microphase separation into different domains.

Block copolymers self-assemble into these microphase domains at certain conditions, as described above with reference to FIG. 1. Ordered domains as shown in FIG. 2 may be used as a templates for patterns. For example, Park et al. (Science, 1997 276, 1401) describe diblock copolymer films deposited on silicon substrates. The diblock copolymer microphase separated into a periodic array of spheres. The block that formed the spheres was removed, leaving the remaining block with spherical holes, similar to that shown in FIG. 2. The remaining block was then used as a mask to etch a dense array of holes (approximately $10^{11}$ holes/cm$^2$) into the silicon substrate. Li et al. (Applied Physics Letters, 2000, 76, 1689) describe using block copolymers as a template to pattern a silicon nitride hard mask, which was then used to grow gallium arsenide nanostructures. Both of these uses of diblock copolymers require a breakthough etch step to transfer the pattern from the block to the substrate. Asakawa et al. (Jpn. J. Applied Physics, 2002, 41, 6112) describe etching a spherically ordered polystyrene-b-poly methyl methacylate (PS-b-PMMA) diblock copolymer film on a substrate with reactive ion etching (RIE). RIE preferentially etched the PMMA, resulting in a direct transfer of the pattern from the block copolymer film to the substrate. Applications for using block copolymer domains as templates for patterning include growing ultrahigh density nanowire arrays (see Thurn-Albrecht et al., Science, 2000, 290, 2126) and fabricating low-voltage scalable nanocrystal FLASH memory (Guarini et al., IBM Semiconductor Research and Development Center, 2004 IEEE IEDM Conference presentation). All of the above references are hereby incorporated by reference for all purposes.

The block copolymer films in the above-described techniques self-assemble without any direction or guidance. However, undirected self-assembly is not appropriate for applications requiring registration of domains with the underlying substrate and the creation of addressable arrays. Directed self-assembly of block copolymers may be used to fabricate features in the tens of nanometers—dimensions at which fabrication of features by lithographic techniques are impractical or impossible.

Previous methods of directing self-assembled copolymer films involve growing diblock copolymers vertically up from the two-dimensional patterned substrate to replicate the pattern in the film. One such approach combines advanced lithography with self-block copolymer self-assembly. Lithographically patterned surfaces are used to direct assembly of block copolymer domains. The approach achieves macroscopic ordering of the domains with registration of the underlying chemical pattern. FIGS. 3A and 3B show how lamellar and cylindrical domains may be formed on a substrate by this technique. FIG. 3A shows guided self-assembly of lamellar domains on a substrate covered with an imaging layer. In the first step, interferometric lithography is used to create a periodic pattern in the imaging layer. In this case, a linear striped pattern is created. A block copolymer film is then deposited on the patterned imaging layer. The copolymer film is then annealed to form an array of self-assembled domains of one block 301 of the copolymer that are surrounded by the other block 302. Selective functionalization of the patterned structure may then be carried out, for example, by removing one block and then filling the opening with another material. FIG. 3B shows guided self-assembly of cylindrical domains. The process is the same as that for the lamellar domains, only differing in the pattern created in the imaging layer, and the bulk morphology of the deposited material. In this case, the pattern is a hexagonal array of circles. Cylindrical domains of one block 303 surrounded by the other block 304 are formed. The methods depicted in FIGS. 3A and 3B, as well as other methods in which a film is grown vertically up to replicate the pattern on the substrate, produce films which are unchanging in the vertical direction. The 2-D projection of a plane of the two-phase film parallel to the substrate shown in FIGS. 3A and 3B matches the associated substrate patterns.

In the approaches described above with respect to FIGS. 3A and 3B, the substrate pattern "matches" the bulk morphology of the block copolymer; i.e., to direct assembly of a block co-polymer that exhibits lamellar morphology in the bulk, a substrate pattern having stripes is used, the alternating stripes corresponding to the lamellae of the bulk morphology. To direct assembly of a block co-polymer that exhibits perpendicular cylindrical morphology, a hexagonal array of circles is used, with the circles of the pattern corresponding to the cylinders of the bulk morphology. To direct assembly of a block copolymer of a block copolymer that exhibits parallel cylindrical morphology, an alternating stripes pattern may be used, with alternate stripes corresponding to the cylinders (see, e.g., "Directed Assembly of Cylinder-Forming Block Copolymer Films and Thermodynamic Induced Cylinder to Sphere Transition: A Hierarchical Route to Linear Arrays of Nanodots," Nano Letters, 2005 Vol. 5, No. 7, 1379-1384 and "Long-Range Order and Orientation of Cylinder Forming Block Copolymers on Chemically Nanopatterned Striped Surfaces," Macromolecules, 2006, 39, 3598-3607, both of which references are hereby incorporated by reference).

The present invention provides methods of forming thin-film, registered block copolymer structures that have three-dimensional morphologies. The methods involve depositing block copolymer materials on substrates whose natural bulk morphology does not match the pattern of the underlying substrate. As indicated above, certain embodiments of the present invention involve fabricating complex three-dimensional structures. The complex 3-D structures of the present invention are thermodynamically stable, i.e., they are not trapped non-equilibrium structures that are impossible to replicate or control. Rather these are the equilibrium structures, as a result of the delicate balance between the physics that determine the bulk block copolymer morphology (as shown in FIG. 1) and the substrate-surface interfacial interactions. The interaction of the copolymer material with the mismatched surface alters the balance of energy and makes the resulting complex 3-D morphologies the most energetically favorable and thus thermodynamically stable. Because they are the equilibrated structures, they are controllable and reproducible. The film morphology may be controlled by adjusting the substrate pattern and the composition of the copolymer material.

The complex 3-D structures of the present invention include films that are non-uniform in a direction perpendicular to the substrate. Films for which the symmetry of a plane that encompasses all phases of the block copolymer and is co-planar with the film (and underlying substrate) differs from the symmetry of any other such plane have 3-D complexity.

The structures shown in FIG. 2 do not have 3-D complexity—rather they are uniform in a direction perpendicular to the underlying substrate. The lamellar and perpendicular cylindrical morphologies are invariant in that direction; while the spheres and parallel cylinders repeat uniformly.

Nor does a film that grown up vertically from an aperiodically patterned substrate to replicate the aperiodic pattern in the film have 3-D complexity. Such films are described in U.S. patent application Ser. No. 11/286,260, filed Nov. 22, 2005, hereby incorporated by reference.

Structures that may be formed by the methods of this invention include films with bicontinous morphologies. A phase exhibits continuous morphology if there is a path that connects any two point in that phase that does not enter any other phase. Bicontinous morphologies have two such phases; the phases of a diblock copolymer exhibiting bicontinuous morphology are interpenetrating meshes, both of which are completely continuous.

Structures that may be formed by the methods of this invention include structures that have a morphology that differs from both the substrate pattern used to grow the film and the bulk morphology of the material.

Structures that may be formed include structures having a "blend" morphology, in which the structure follows the substrate pattern at the substrate and then deviates at intermediate thicknesses to such that it has a different symmetry at the at the film surface. In certain embodiments, the structures exhibit long-range order at the substrate surface, and short-range order at intermediate distances and/or the film surface.

Structures of the invention also include films having phases or elements that do not correspond to the underlying 2-D substrate.

Figure 4:
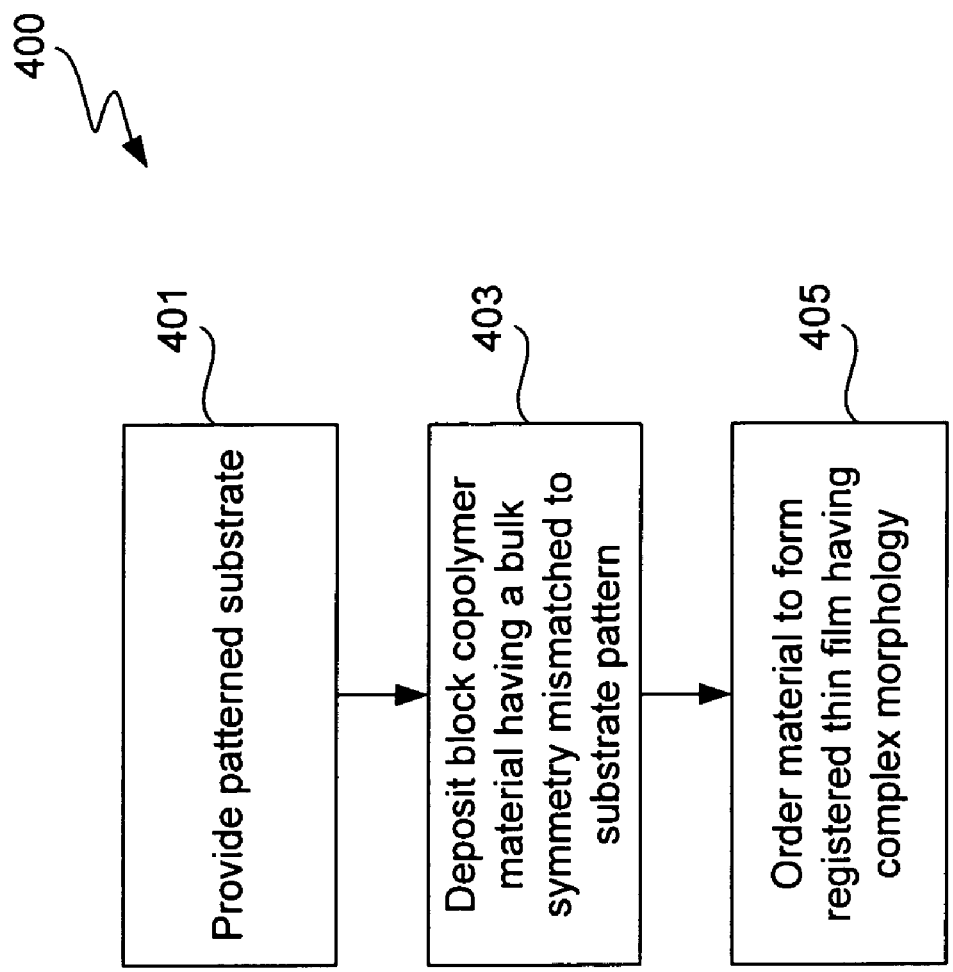
FIG. 4 is a flowchart showing a process of forming a registered block copolymer film having complex morphology on a substrate according to one embodiment of the invention.

FIG. 4 is a flowchart showing the operations of a process 400 according to one embodiment of the invention. At operation 401, a patterned substrate is provided. The substrate may be chemically patterned or otherwise activated. At operation 403, a layer of material comprising a block copolymer with "mismatched" symmetry is deposited on the substrate. The material may be a block copolymer, a block copolymer/homopolymer blend, or other suitable blend of a block copolymer with another material as described further below. Components of the block copolymer material are then ordered to form a registered, complex copolymer film in operation 405. To induce ordering, the block copolymer material is typically annealed above the glass transition temperature of the blocks of the copolymer material.

Figure 5A:
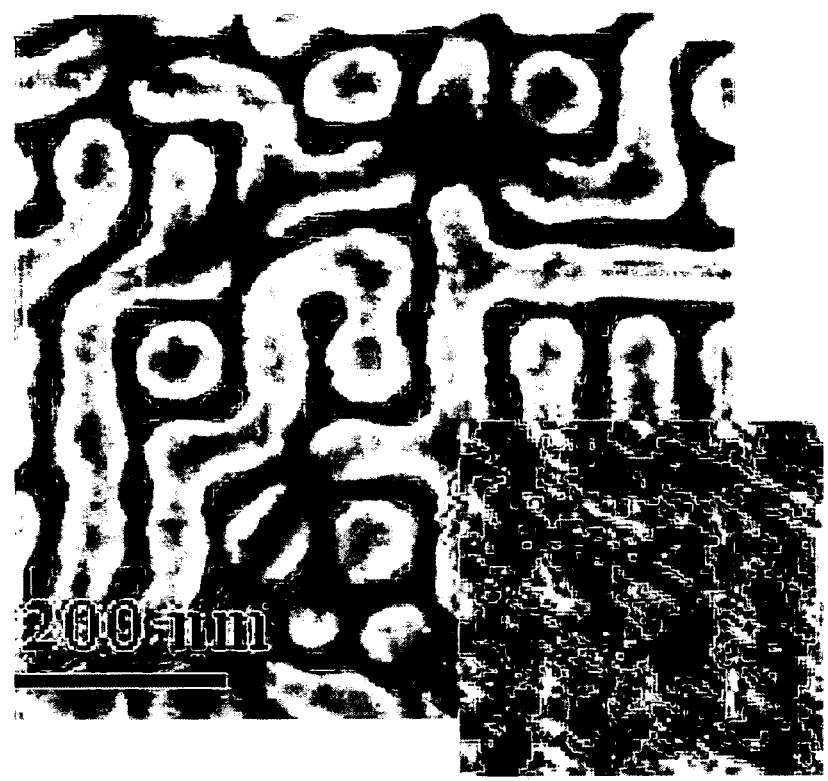
FIG. 5A shows an SEM image of the surface of a film formed by depositing a ternary PS-b-PMMA PS/PMMA blend on a substrate patterned with square array of spots. The ternary blend orders into a lamellar morphology in the bulk.
Figure 5B:
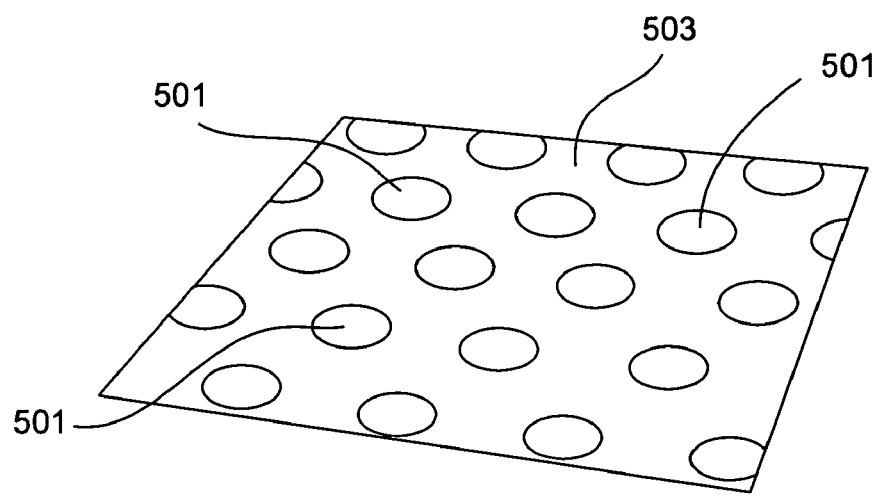
FIG. 5B is a rough schematic of the chemically patterned substrate on which the film shown in FIG. 5A was deposited.
Figure 5C:
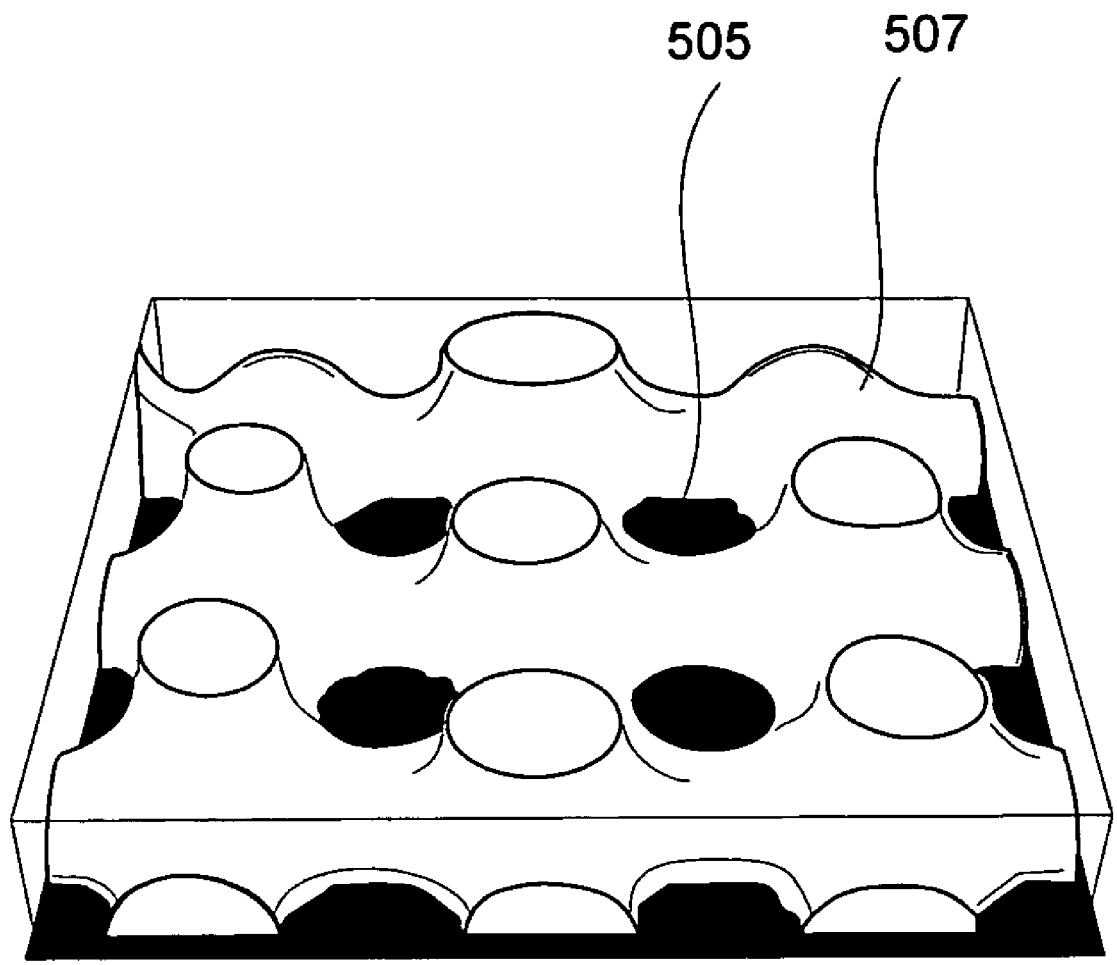
FIG. 5C shows a schematic of a quadratically perforated lamella (QPL) morphology.

An example of a complex 3-D structure formed by the methods of the invention is shown in FIG. 5A, which shows an SEM image of a surface of the film formed by depositing a ternary PS-b-PMMA PS/PMMA blend on a square array of spots. The blend orders into a lamellar morphology in the bulk. The PS-domains are shown in white and the PMMA-domains in dark grey. (The PS-domains appear artificially large in the SEM image; the inset shows an AFM image of a portion of the surface, which provides a more realistic view of the relative size of the phases.) Importantly, the phases are registered with the substrate and exhibit long-range order at the substrate. A schematic of the patterned substrate is shown in FIG. 5B, with spots 501 of chemically modified PS surrounded by unmodified PS region 503. As can be seen by comparing the film surface (in FIG. 5A) to the patterned substrate (in FIG. 5B), the symmetry of the film surface differs greatly from that of the pattern. Neither the PS nor PMMA regions of the film surface correspond to the 2-D pattern on the substrate. The film at the substrate is a single quadratically perforated lamella (QPL), an example of which is shown in FIG. 5C. PMMA-domains form the perforations in the lamella (505) and correspond to the spots on the substrate while PS-domains forms the lamella (507) and correspond to the area 503 of the substrate shown in FIG. 5B. The QPL exhibits long-range order and is perfectly registered with the substrate, with the PMMA-domains and PS-domains aligned with areas 501 and 503, respectively, of the substrate shown in FIG. 5B. As is discussed further below, PS-rich "necks" connect the QPL to the top of film, and the structure is bicontinuous. The PS and PMMA regions at the film surface are addressable from the side of the film assembled at the substrate.

Figure 6:
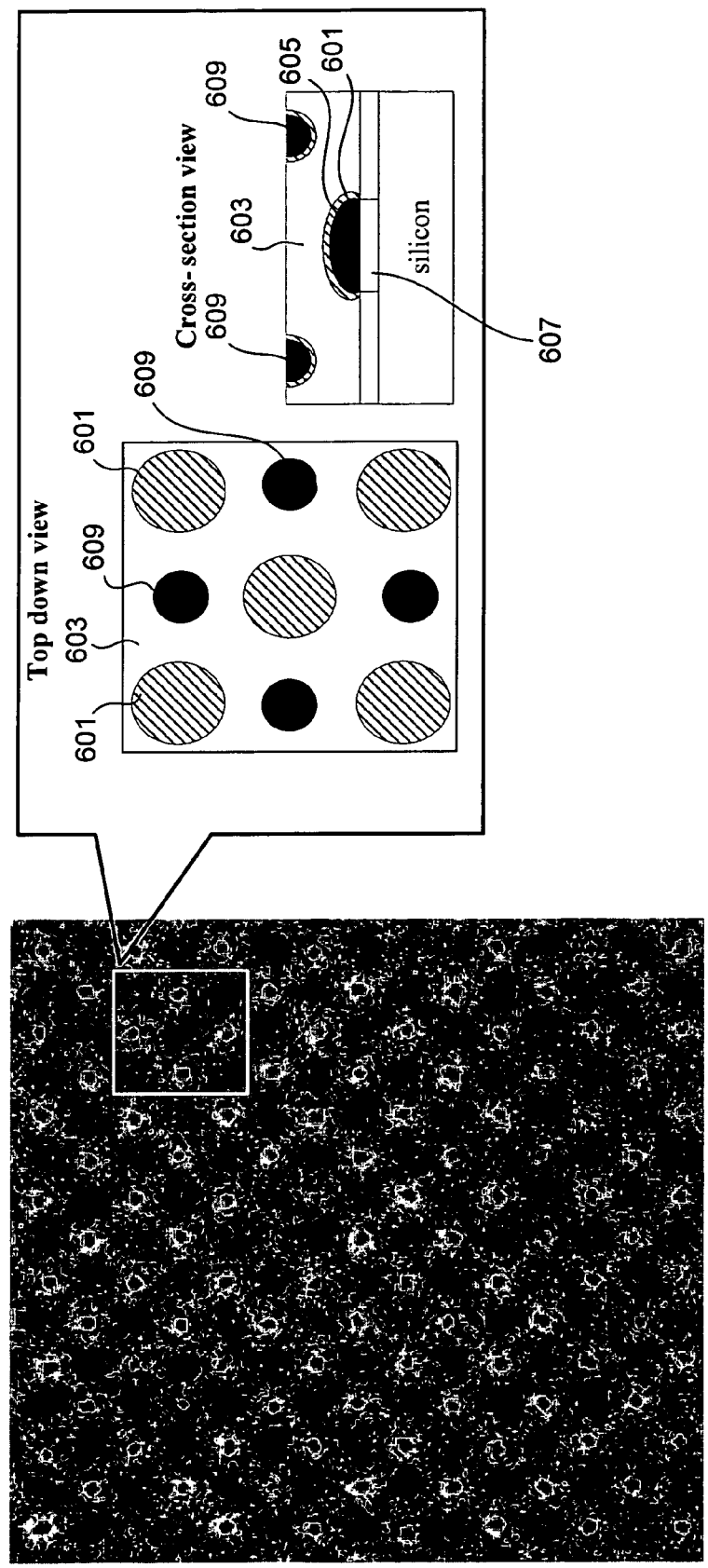
FIG. 6 shows an SEM image of spherical PS-b-PMMA deposited on a substrate chemically patterned with a square array of spots having $L_S$ of 80 nm. Schematics of the top and cross-sectional views of the film are also shown.

Another example of a complex 3-D thin film structure that may be formed by the methods of the invention is shown in FIG. 6, which shows an SEM image of spherical PS-b-PMMA deposited on a chemically patterned substrate patterned by a square array of spots (such as that shown in FIG. 5B). In the bulk, the copolymer forms a hexagonal array of spheres of PMMA in a matrix of PS. Top down and cross-sectional views of a unit square of the film are shown adjacent to the SEM image. The grey areas in the schematic indicate PS, the dark areas PMMA and the striped areas indicate the interface between PS and PMMA. Thus, the spots 601 (interface) correspond to PMMA over the PMMA wetting spots on the patterned substrate, which are covered with PS. This is illustrated in the cross-sectional view, which shows an interfacial area 601 between the PS matrix 603 and PMMA spot 605 on PMMA wetting spot 607. Black spots 609 are PMMA (these are also shown as the small black spots in the SEM image). As shown in the cross-sectional view, these PMMA spots do not correspond to the underlying substrate. Nor do they correspond to the bulk morphology of this PS-b-PMMA copolymer material, which is hexagonally arrayed spheres of PMMA in a PS matrix. Thus, the film shows a first symmetry at the substrate, and a second symmetry at the surface of the 30 nm film, specifically, at the substrate the film exhibits an array of large domed structures whose dimensions (diameter and spacing) depend on the patterned substrate while at the surface the film exhibits an array of smaller inverted domed structures whose dimensions are thermodynamically controlled by equilibrating the system.

Unlike the structure shown in FIG. 5A, the structure in FIG. 6 does not exhibit a bicontinuous morphology; however the morphology does have elements that give it 3-D complexity, as the spheres 609 do not correspond to the underlying substrate. The PS-matrix 603 and PMMA spots 605 are registered at the substrate; spheres 609 are not.

The morphologies observed in the above-described thin films are due to strong preferential interactions between the components of copolymer material and chemically patterned substrate and the mismatch between the substrate pattern and the bulk morphology of the copolymer; i.e. competition between the square symmetry imposed by the patterned substrate and the natural tendency of the copolymers to assume a lamellar (in FIG. 5A) or hexagonally arrayed spherical (in FIG. 6) morphology. Notably, the films are registered at the substrate surface, and in the case of the bicontinuous film, all phases are registered and addressable. Additional descriptions of complex 3-D films that may be formed by the methods of the invention are provided below.

Substrate

Any type of substrate may be used. In semiconductor applications, wherein the block copolymer film is to be used as a resist mask for further processing, substrates such as silicon or gallium arsenide may be used. According to various embodiments, the substrate may be provided with an imaging layer thereon. The imaging layer may comprise any type of material that can be patterned or selectively activated. In a preferred embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane. (See also Peters, R. D., Yang, X. M., Kim, T. K., Sohn, B. H., Nealey, P. F., Using Self-Assembled Monolayers Exposed to X-rays to Control the Wetting Behavior of Thin Films of Block Copolymers, Langmuir, 2000, 16, 4625-4631; Kim, T. K., Sohn, B. H., Yang, X. M., Peters, R. D., Nealey, P. F., Chemical Modification of Self-Assembled Monolayers by Exposure to Soft X-rays in Air, Journal of Physical Chemistry B, 2000, 104, 7403-7410. Peters, R. D., Yang, X. M., Nealey, P. F, Wetting behavior of block copolymers self-assembled films of alkylchlorosilanes: Effect of grafting density, Langmuir, 2000, 16, p. 9620-9626, each of which is hereby incorporated by reference in its entirety and for all purposes.) In certain embodiments, the imaging layer comprises a polymer brush. In a particular embodiment, the polymer brush comprises homopolymers or copolymers of the monomers that comprise the block copolymer material. For example, a polymer brush comprised of at least one of styrene and methyl methylacrylate may be used where the block copolymer material is PS-b-PMMA.

Applications of the films and methods of the present invention are not limited to semiconductor processing, but include biological applications, preparation of membranes for separations or as catalyst supports, nanoscale filtering, etc. The substrate may be dictated by the particular application, for example appropriate substrates for biological applications may be biologically compatible.

Pattern

In order to drive the formation of complex thin film structures according to the methods of the invention, the substrate pattern and the copolymer material are mismatched. Mismatch refers to the pattern and the bulk morphology of the material having incommensurate symmetries and/or length scales.

Block copolymer films have a bulk lamellar length scale, $L_o$. For diblock copolymers, $L_o$ is the length of one diblock in the bulk. Similarly, patterns have length scales. The pattern length scale $L_s$ of an alternating stripes pattern used to is the distance between alternate interfaces on the pattern (i.e. the width of two stripes). For cylindrical and spherical domain structures, the length scale of the bulk domain structures can be characterized by the distance between the cylinders or spheres in the hexagonal array. Similarly, length scales of bulk morphologies formed by triblock and higher order copolymers may be characterized.

As indicated above, bulk morphologies of diblock copolymers include lamellar and hexagonally-arrayed cylinders and spheres. Patterns of square arrays have different symmetries from both lamellar and hexagonal symmetries. For lamellar and parallel forming copolymer materials, patterns that do not have alternating stripes are mismatched symmetries that correspond to these phases, including patterns with spots. Similarly, any pattern that does not have hexagonally-arrayed wetting spots that are preferential to the cylinder or sphere-forming phase of the cylindrical or spherical forming copolymer material are considered mismatched to that material.

The pattern may be mismatched from the copolymer material in length scale (in addition to or instead of symmetry). For example, for FIG. 5A, the length scale of the pattern, $L_s$ (nearest neighbor center-to-center distance) is $1.21 L_o$ (with $L_o$ of the lamella-forming PS-b-PMMA/PS/PMMA block copolymer blend 70 nm). However, in many embodiments in order to form the complex 3-D films as described, the length scale of the substrate pattern should be within the same order of magnitude as the length scale of the bulk morphology in order for the strong preferential interactions to result in novel structures rather than simply inducing the bulk-like domain structures to form parallel to the substrate as is typically the case for assembly on homogeneous substrates. Thus, in many embodiments, the methods rely on the mismatch between the pattern and bulk morphology symmetries to drive the formation of the thin films having 3-D complexity.

Patterns may be periodic or aperiodic. Examples of aperiodic patterns appear in U.S. patent application Ser. No. 11/286,260 incorporated by reference above. Patterns may also include both periodic and aperiodic regions.

In certain embodiments, the film at the substrate corresponds to the substrate pattern (e.g., the QPL in FIG. 5C). This is driven by the substrate surface interactions. In certain embodiments, this may be achieved with an imperfect substrate pattern, e.g., if the pattern shown in FIG. 5B that drives assembly of the QPL at the substrate were missing one or more circular wetting spots.

Patterning the Substrate

The substrate may be patterned by any method including chemical, topographical, optical, electrical, mechanical patterning and all other methods of selectively activating the substrate. In embodiments where the substrate is provided with an imaging layer, patterning the substrate may comprise patterning the imaging layer. The substrate patterning may comprise top-down patterning (e.g. lithography), bottom-up assembly (e.g. block copolymer self-assembly), or a combination of top-down and bottom-up techniques. FIG. 7 shows an example of one procedure that may be used to pattern a substrate. First, a PS brush is grafted to a substrate. A thin film of photoresist is then deposited on the PS brush (701). The photoresist is patterned by extreme ultraviolet (EUV) interference lithography (702). In the example shown in FIG. 7, the substrate is patterned with spots. The substrate is then treated with an oxygen plasma to modify the PS regions not covered with photoresist (i.e., the spots) to be oxygen-rich and highly polar (703). Removal of the remaining photoresist then results in the desired chemically patterned substrate (704). PMMA preferentially wets the spots and PS the region surrounding the spots. Block copolymer material may then be deposited on the patterned substrate to form the films of the invention (705).

Alternatively, a substrate may be patterned by selectively applying the pattern material to the substrate.

The substrate patterning may comprise top-down patterning (e.g. lithography), bottom-up assembly (e.g. block copolymer self-assembly), or a combination of top-down and bottom-up techniques. For example, a process for directed self-assembly may be used in conjunction with lithography to create sub-lithographic resolution patterns. In one technique, lithography may be used to activate desired regions on the substrate thereby defining gross features. A block copolymer material is then deposited on the activated regions and phase segregation is induced to direct self-assembly of the copolymer into domains. One block of the copolymer may then be selectively removed. The exposed regions of the substrate would then be selectively activated, thereby creating the pattern on the substrate.

In a particular embodiments, the substrate is patterned with x-ray lithography, extreme ultraviolet (EV) lithography or electron beam lithography.

Block Copolymer Material

The block copolymer material contains a block copolymer. The block copolymer may have any number of distinct block polymers (i.e. diblock copolymers, triblock copolymers, etc.). In a particular embodiment, the block copolymer is a diblock copolymer. A specific example is the diblock coplymer PS-b-PMMA.

The block copolymer material may further comprise one or more additional block copolymers. In some embodiments, the material is a block copolymer/block copolymer blend. An example of a block copolymer/block copolymer blend is PS-b-PMMA (50 kg/mol)/PS-b-PMMA (100 kg/mol).

The block copolymer material may also further comprise one or more homopolymers. In some embodiments, the material is a block copolymer/homopolymer blend, e.g., a block copolymer/homopolymer/homopolymer blend. In a particular embodiment, the material is a PS-b-PMMA/PS/PMMA blend.

The block copolymer material may comprise any swellable material. Examples of swellable materials include volatile and non-volatile solvents, surfactants, plasticizers and supercritical fluids. In some embodiments, the block copolymer material contains nanoparticles dispersed throughout the material. The nanoparticles may be selectively removed after formation of the film.

Applications

Applications include enhancing the lithographic process through the introduction of information rich materials such that multiple device layers or multiple device materials can be patterned in one lithographic exposure step, or that simple patterns in the aerial image of the exposure tool (lines or spots) can be facilely transformed via directed assembly into complex architectures and reducing the cost of manufacturing at the nanoscale. The structures may be used in pattern transfer applications (e.g., as etch masks) or one or more blocks may be replaced by materials including metals, semiconductors, dielectrics, biological materials (proteins, nucleic acids) or materials that interact with them, e.g., to form particular structures.

Simple-to-create patterns of lines or spots are transformed into rich three-dimensional structures due to the self-assembling nature of the triblock copolymer films. For all types of morphologies, the essential properties of device fabrication may be retained: the lithographic or other patterning step assures that the assemblies are defect free (in fact the self-assembly nature of the copolymer materials would heal some of the lithography errors or noise) and precisely registered for interconnects or other input/output strategies.

Further applications include additive and subtractive templating processes to transfer the domain structure of the polymer films into patterns of metals, semiconductors, and dielectrics. For example, poly(isoprene) and can be selectively removed from the three dimensional structures by exposure to ozone to create soft masks for etching, or the voids can be backfilled by electrodeposition of metals. Polyethylene oxide domains can be selectively infused with metal alkoxides in supercritical carbon dioxide, and condensation reactions result in patterned metal oxide or silicate domains. Poly(ethylene oxide)/poly(acrylic acid) blend domains may be used as nanoreactors for synthesizing nanoclusters and nanoparticles synthesized in-situ. Poly(styrene) is often used as the structural support material for the nanostructures.

The capabilities of manufacturing at the nanoscale using directed self-assembly is significantly enhanced by the 3-D structures created from single 2D templates as described herein, retaining the lithographic properties of perfection and registration, especially for device applications. For technological applications, in addition to the innate importance of the multiple continuous network structures described herein, each component of the bicontinuous morphology may be readily addressed from the side of the film assembled at the substrate surface. Potential applications of these nanostructures include catalysis, separation membranes, fuel cells, and the creation of materials with interesting mechanical or optical properties.

Film Morphology

The films of the invention have complex 3-D morphology, which include films that are non-uniform in a direction perpendicular to the substrate.

In certain embodiments, the morphology of the films of the present invention may be described by looking at the 2-D symmetry of planes that encompass all components of the block copolymer (e.g., in a PS-b-PMMA block copolymer, planes that contains both PS and PMMA) and are co-planar with the film (and the underlying substrate). In certain embodiments, the films of the present invention have at least two such planes that have differing symmetry.

For example, referring to FIGS. 5A and 5C, the film forms a QPL of PS-rich lamella perforated by PMMA, then deviating to the morphology shown in FIG. 5A, and so is non-uniform in a direction perpendicular substrate. Likewise, referring to FIG. 6, the cross-section shows that there are large PMMA spots or half-spheres (605) at the substrate, and smaller PMMA spheres (609) off-set from spots on the substrate. Spheres 609 would be expected to repeat at greater film thicknesses, until the film has reached a thickness at which it would revert to its bulk morphology.

In certain embodiments, the films of the present invention have phases or elements that do not correspond to the patterned substrate. For example, the PMMA spots 609 in FIG. 6 do not correspond to the substrate pattern.

The films of the present invention display long-range order at the substrate, e.g., the QPL (as depicted in FIG. 5C) formed at the substrate of the film shown in FIG. 5A displays long-range order in directions parallel to the substrate. Depending on the thickness of the film, short-range or long-range order may be exhibited. For example, at the intermediate thickness shown in FIG. 6, the film displays long-range order. However, in FIG. 5A, the surface of the film does not exhibit long-range order. As discussed below, with reference to the Examples, this and similar films display varying degrees of order at the film surface.

In certain embodiments, the films of the invention exhibit bicontinous morphologies. As indicated above, a phase exhibits continuous morphology if there is a path that connects any two point in that phase that does not enter any other phase. Bicontinous morphologies have two such phases; the phases of a diblock copolymer exhibiting bicontinuous morphology are interpenetrating meshes, both of which are completely continuous. Also in certain embodiments, the films have more than two continuous phases.

Figure 11:
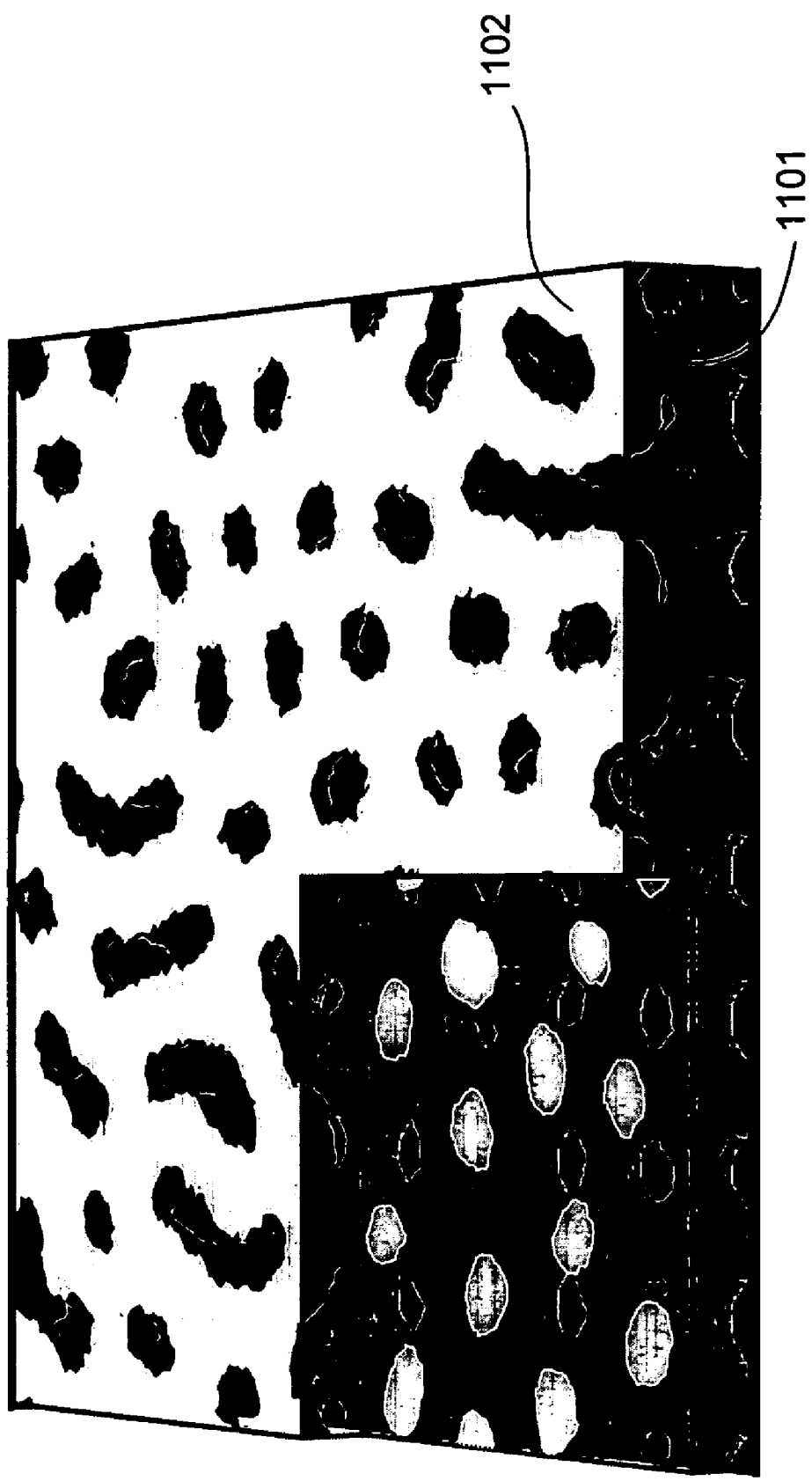
FIG. 11 provides an image of a 88 nm thick film formed by depositing a lamellar-forming PS-b-PMMA/PS/PMMA on a substrate patterned with a square array of spots having $L_s$ of $1.21L_0$ and spot radii R of $0.41L_0$ as generated by a SCMF simulation.

At some thickness, the copolymer material is expected to revert to its bulk morphology; however the interactions with the surface pattern affect the resulting film for thicknesses extending, for example, into the hundreds of nanometers. In FIG. 11, for example, a thin film showing alternating PS-rich and PMMA-rich perforated sheets of about 90 nm is shown. This alternating pattern would be expected to continue at greater thicknesses before the film reverts to its lamellar bulk morphology. In many embodiments of the present invention, the film thickness is such that the film has not reverted to its bulk morphology; i.e., the symmetry at the surface of the film differs from the bulk morphology (as well as the substrate pattern symmetry). However, in certain embodiments, the films of the invention may be of thicknesses at which the film has reverted to its bulk morphology.

The structure of the films is thermodynamically stable and results from strong preferential interactions between the components of the blend and the surface, and the mismatch between the morphology of the blend in the bulk and the geometry of the chemical surface pattern.

EXAMPLES

The following examples provide details illustrating aspects of the present invention. These examples are provided to exemplify and more clearly illustrate these aspects of the invention and are in no way intended to be limiting.

Examples 1-4 show results of experiments and simulations of a copolymer blend that forms lamellae in the bulk deposited on substrates patterned with a square array of spots. Example 5 shows results of experiments and simulations of a copolymer blend that forms hexagonally-arrayed cylinders in the bulk deposited on substrates patterned with a square array of spots. Example 6 shows results of experiments and simulations of a copolymer blend that forms hexagonally-arrayed spheres in the bulk deposited on substrates patterned with a square array of spots.

Example 1

A ~4 nm brush of polystyrene, PS, was grafted to a silicon substrate. A thin film of photoresist was subsequently deposited and patterned by four-beam extreme ultraviolet interference lithography. The resultant patterns in the photoresist layer consisted of square arrays of spots with nearest neighbor center-to-center distances of 71 nm$\leq L_s \leq$113 nm and a wide range of spot radii, R. The sample was then treated with an oxygen plasma such that PS brush regions not covered with photoresist were chemically modified to be oxygen-rich and highly polar. Removal of the remaining photoresist resulted in the desired chemically patterned substrate. A 44 nm film of a symmetric ternary blend, consisting of 60 wt. % poly(styrene-b-methyl methacrylate) (PS-b-PMMA, Mn=104 kg/mol, bulk lamellar period of 49 nm), 20 wt. % PS (40 kg/mol), and 20 wt. % poly(methyl methacrylate) (PMMA, 41 kg/mol), was deposited on the patterned substrate and annealed at 190° C. for 7 days. In thin films on uniform substrates this blend orders into a lamellar phase with a periodicity of $L_0$=70 nm. On the patterned substrate the PS-domains preferentially wet the chemically unmodified regions of the PS brush, while the PMMA-domains preferentially wet the oxygen plasma treated regions. Scanning electron microscopy (SEM) and atomic force microscopy (AFM) were used to examine the top surface of the thin films of ternary blend.

In addition, a Single Chain in Mean Field (SCMF) simulation approach was utilized to study the 3D structure of the ternary blend on the patterned substrate after a quench from the disordered phase. Details of this approach may be found in U.S. Provisional Applications No. 60/724,554 and 60/761,863, incorporated by reference above.

Figure 8B:
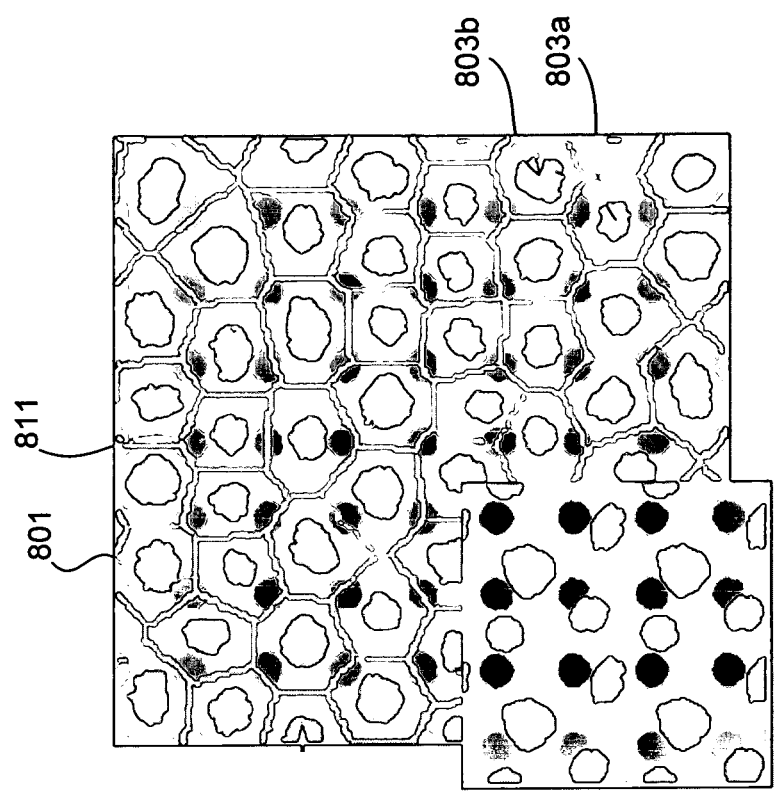
FIG. 8B provides a top view of the film in FIG. 8A generated from a SCMF simulation.
Figure 8A:
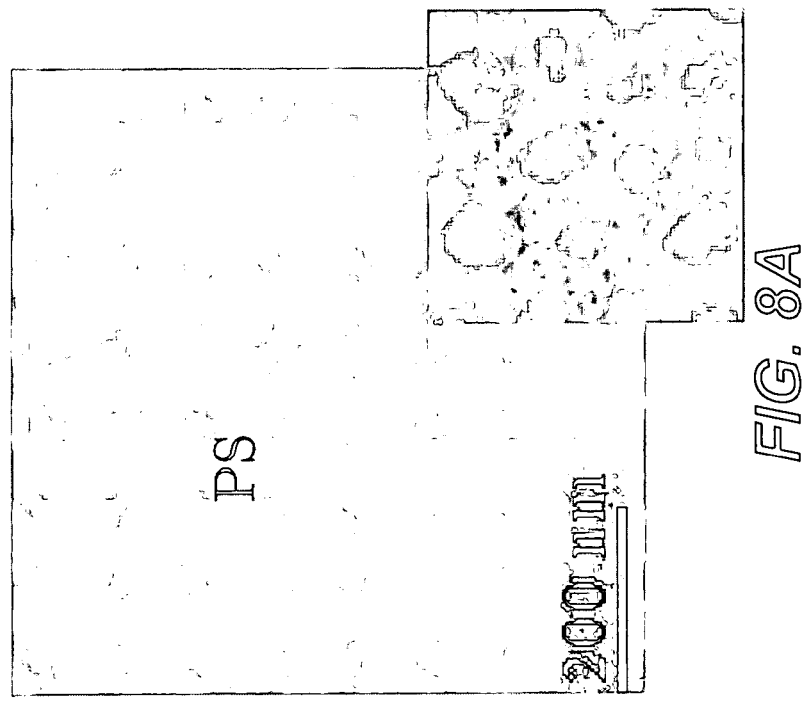
FIG. 8A is an SEM image of the surface of a film formed by depositing a lamellar-forming PS-b-PMMA PS/PMMA blend on a substrate patterned with a square array of spots having $L_s$ of $1.21L_0$ and spot radii R of $0.30L_0$.
Figure 8C:
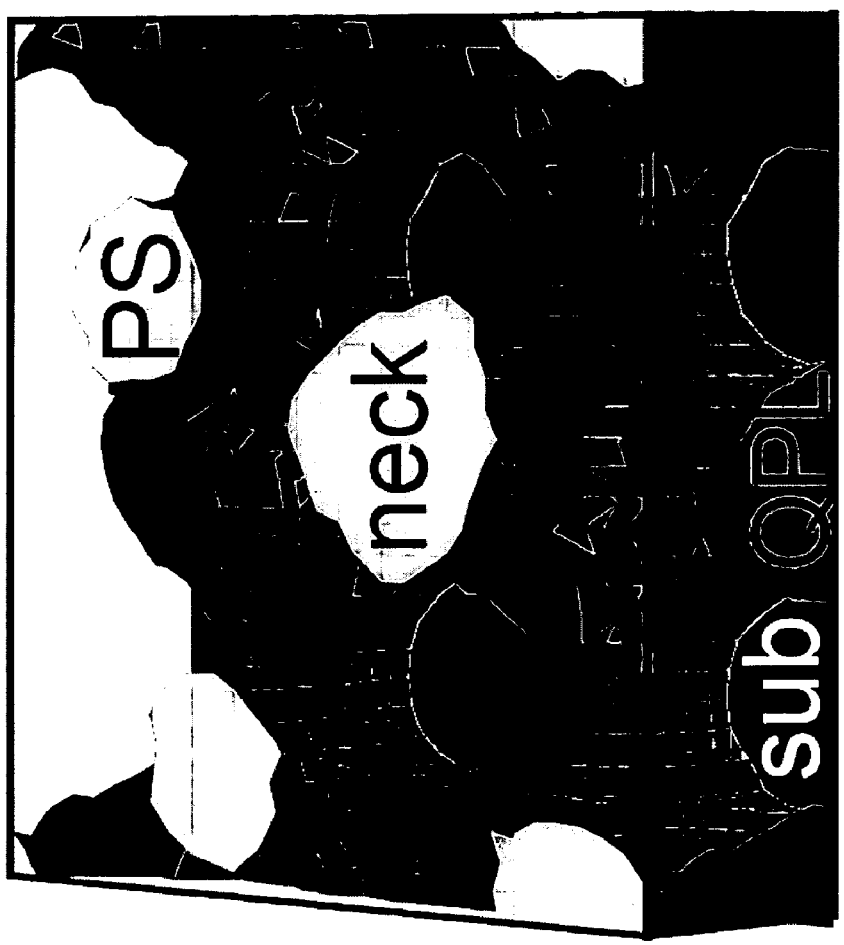
FIG. 8C provides an image of the film in FIG. 8A generated from a Monte Carlo simulation.

FIGS. 8A-C show films resulting from depositing the PS-b-PMMA/PS/PMMA blend on a substrate having $L_s$ of $1.2L_0$ and spot radii R of $0.30L_0$. The film had a thickness of $0.63L_0$ and lateral dimensions of $9.77L_0$. FIG. 8A shows an SEM image of the surface of the film. The PS-domains are shown in light grey and the PMMA-domains in dark grey. The PS-domains appear artificially large in the SEM image; a more accurate view of the domain sizes is provided by an AFM image shown as an inset to FIG. 8A in the lower right corner. FIG. 8B shows an image from an SCMF simulation of the film. PS-rich domains are shown in white (e.g., reference numbers 803a and 803b). The interface between the PS and PMMA is shown in dark grey (801). Regions on top of the spots are PMMA rich (not shown or transparent) and the view looks down to the substrate in black. The visible regions of the substrate (i.e., black spots 811) are the PMMA-attracting spots of the substrate; they are visible in this view because the PMMA-domains are transparent in this figure. PS spots between two PMMA-attracting spots of the substrate (spot 803a) are said to be at a "bridge" position. PS spots at the center of a plaquette of four PMMA-attracting spots (spot 803b) are said to be at an "interstitial" position.

At the substrate, a long-range ordered, single quadratically perforated lamella (QPL) formed (see FIG. 5C for an example of a QPL). A long-range ordered and perfectly registered, single QPL formed for all patterns (i.e., of various Ls and R values) at the substrate. The thickness of this QPL sheet is about $L_0/5$. This morphology is not observed in the bulk or on uniform substrates; it is enforced by the substrate interactions that are sufficiently strong to induce a surface morphology differing in symmetry and characteristic length scale from the bulk structure. As explained below with reference to FIG. 8C, the PS-rich spots shown in FIG. 8B are "necks" that emanate from the PS-rich QPL to connect the QPL to the top of the film. The thin white lines in FIG. 8B indicate the Voronoi tessellation of the necks.

FIG. 8C shows a 3D view of the morphology in the MC simulations. As in FIG. 8B, the PS-domains are in white; the interface between the PS and PMMA in dark grey; the substrate in black; and the PMMA-regions transparent. The PS regions are necks that emanate from the QPL.

On average, the chemically patterned substrate prefers the PS-component and its selectivity increases as we decrease the ratio between the spot radius and spacing, $R/L_s$. The top of the film is PS-depleted forming a perforated PMMA-rich lamella. For small values of $R/L_s$ the perforations consist of necks (short standing cylinders of PS) connecting the QPL underneath to the top of the film and giving rise to a continuous structure. These necks are reminiscent of the surface morphology in thin films of cylinder-forming ABA triblock copolymers on uniform substrates, but here they are observed in a frustrated, lamella-forming blend.

The position of the PS-rich necks or other structures emanating from the QPL is determined by an intricate interplay between their natural size (set by diblock's end-to-end distance $R_e$), their preferred packing in the plane parallel to the substrate, and the geometry (size and curvature) of the location on the QPL to which they are connected. Thus the location and shape of the PS-rich domains at the top of the film (as shown in FIG. 8A) provides substantial but indirect information about the 3D morphology. In FIG. 8C it can be observed that necks do not exhibit long-range order and are not registered with the QPL. Necks that form on bridge positions (cf. FIG. 8B) in the simulations on average have a smaller diameter than those forming at interstitial positions. This partially explains the rather large distribution of neck diameters observed in the experiments. Although the substrate and QPL possess a four-fold symmetry, the Voronoi tessellation exhibits a large fraction of locally sixfold coordinated necks both in experiment and simulation due to the local packing of necks. The competition between the square symmetry imposed by the QPL and the natural tendency for necks to pack into a hexagonal lattice causes frustration, which leads to a spontaneous breaking of the square symmetry. Analysis of correlation functions showed that the hexagonal orientations are strong, but short ranged, whole substrate-induced fourfold orientational correlations are weak, but longer ranged. The necks do not exist in the bulk but self assemble due to substrate interactions and confinement. The film structure is non-uniform perpendicular to the substrate and has 3-D complexity.

Example 2

Figure 9B:
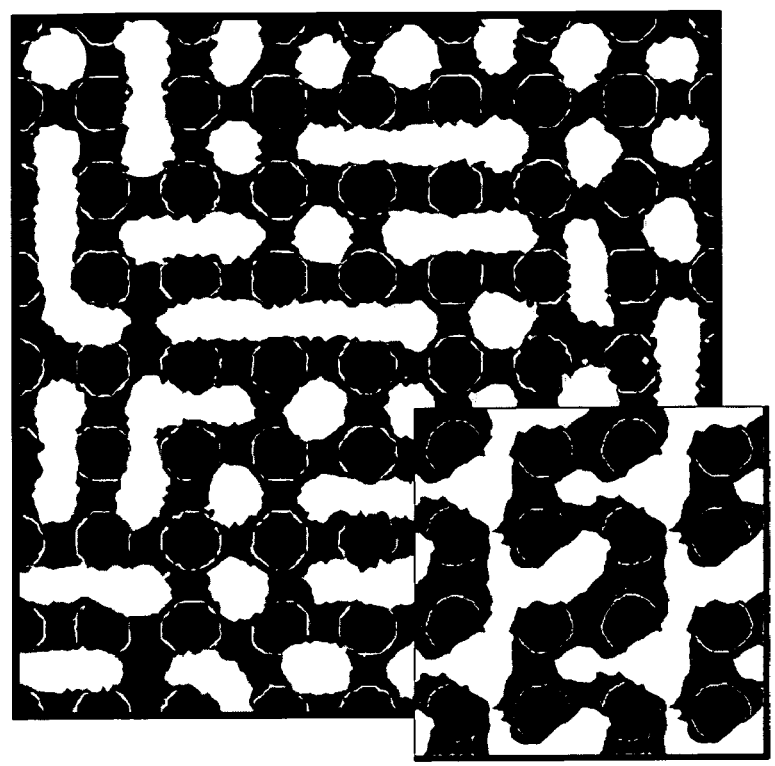
FIG. 9B provides a top view of the film in FIG. 9A generated from a SCMF simulation.
Figure 9A:
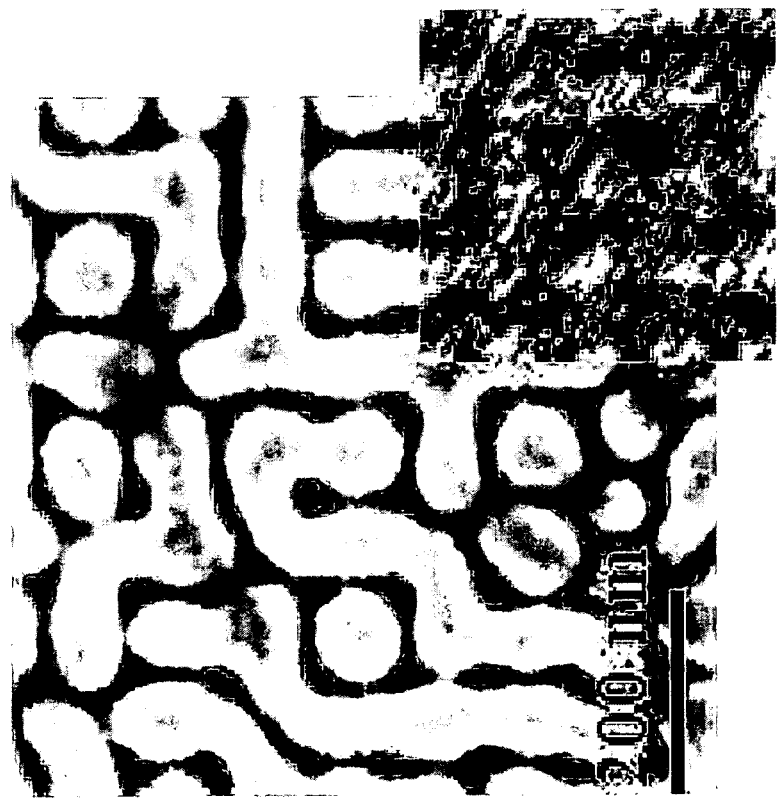
FIG. 9A is an SEM image of the surface of a film formed by depositing a lamellar-forming PS-b-PMMA/PS/PMMA blend on a substrate patterned with a square array of spots having $L_s$ of $1.21L_0$ and spot radii R of $0.41L_0$.

A patterned substrate was prepared having a $L_s$ of $1.21L_0$ and R of $0.41L_0$ and a ternary PS-b-PMMA/PS/PMMA blend was deposited as described in Example 1. Thus, $L_s$ was the same as for the film shown in FIG. 8A in Example 1, but the ratio $R/L_s$ increased. The substrate was less preferential to PS on average than that in Example 1 (as the area of PMMA preferential wetting spots is increased). The amount of PS near the top surface of the film increased facilitating the formation of a bulk-like lamellar morphology. This can be seen in FIG. 9A, an SEM image of the surface of the film (with an AFM image inset to provide a more accurate depiction of the PS/PMMA dimensions), and FIG. 9B, which shows results of the SCMF simulation. Comparing FIGS. 9A and 9B with FIGS. 8A and 8B, it can be seen that for the film prepared in this Example, neighboring necks join into portions of standing lamellae that are connected to the QPL at the substrate and orient along the axis of the QPL. Also, by increasing R, the width of the bridge and interstitial positions is decreased and all necks are now located on the wider interstitial positions. This alignment of the structures with the axis of the QPL was also observed in experiments.

Example 3

Figure 10B:
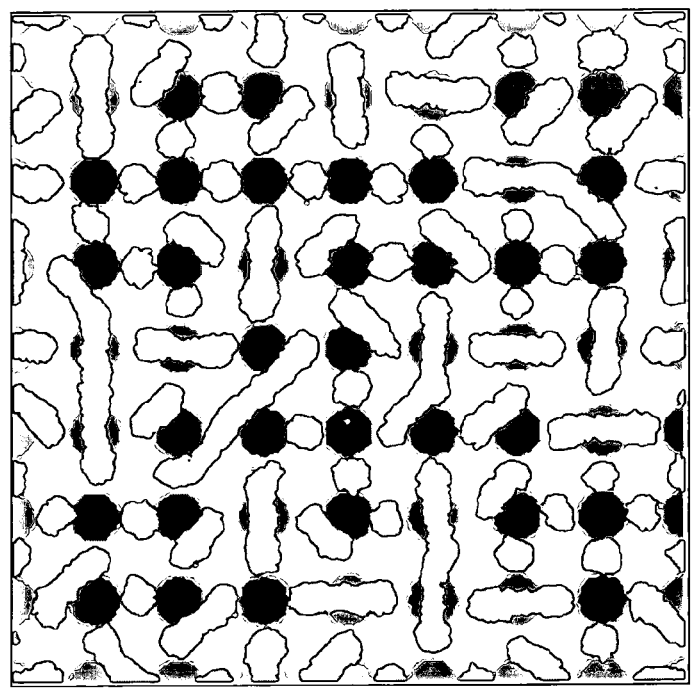
FIG. 10B provides a top view of the film in FIG. 10A generated from a SCMF simulation.
Figure 10A:
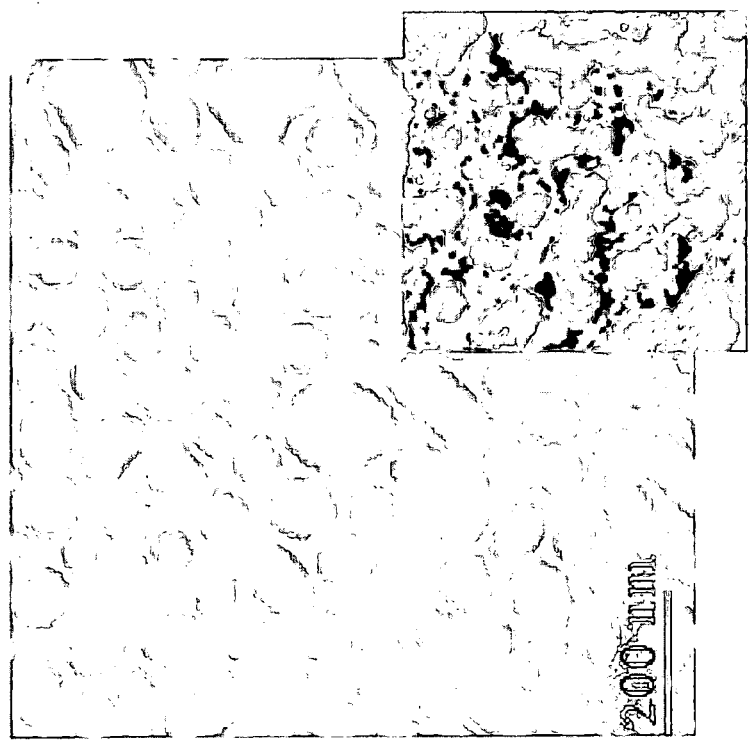
FIG. 10A is an SEM image of the surface of a film formed by depositing a lamellar-forming PS-b-PMMA/PS/PMMA blend on a substrate patterned with a square array of spots having $L_s$ of $1.64L_0$ and spot radii R of $0.51L_0$.

A patterned substrate was prepared having a $L_s$ of $1.64L_0$ and R of $0.51L_0$ and a ternary PS-b-PMMA/PS/PMMA blend was deposited as described in Example 1. The resulting film is shown in FIGS. 10A and 10B, FIG. 10A being the SEM image, FIG. 10B the top view resulting from the SCMF simulation. The necks join into short portions of lamellae as in Example 2. Although the length scale, $L_s$, of the substrate pattern substantially exceeds the bulk period, $L_0$, the substrate interactions force the formation of a QPL at the substrate. The width of the necks and short lamellar portions on the top, however, remains largely unaltered. The portions of lamellae either run along the diagonal or align parallel with the axis of the underlying square lattice. In the latter case, they bridge the PMMA-rich domains of the QPL. In response to the increase of the dimensions of the QPL, all necks now register with the bridge positions that are narrower than the interstitial ones. The bridge positions form a square lattice whose axes are rotated by 45° with respect to the QPL and this diagonal orientation of the necks is clearly visible in the experimental results.

Example 4

As noted above, the films of Examples 1-3 were 44 nm thick. SCMF simulations were performed to simulate thicker films. FIG. 11 shows the results of a simulation of the PS-b-PMMA/PS/PMMA blend as deposited in Example 1, on the same pattern as in Example 1, but for twice the film thickness, $D_0 = 1.27L_0$ (88 nm). The upper half of the film is removed in the lower left corner of FIG. 11. At twice the film thickness there is a PS-rich QPL (1101) at the substrate followed by a PMMA-rich sheet (1102). At greater thicknesses, the film would have alternating PMMA-rich and PS-rich perforated sheets. A hexagonally perforated lamellar morphology has been observed in the bulk using asymmetric block copolymers. However, in contrast to the hexagonally perforated lamellar bulk morphology of those asymmetric diblock copolymers, both the PS-rich and PMMA-rich sheets of the symmetric blend used are perforated giving rise to a bicontinuous morphology. The perforations are disordered and the structure in the middle of the film (PMMA-rich perforated lamella) resembles the surface structure of a film of half the thickness (see FIG. 8B). The pattern formed at the surface of the 44 nm films acts as a new pattern to drive the bicontinous morphology through the film.

Example 5

Figure 12:
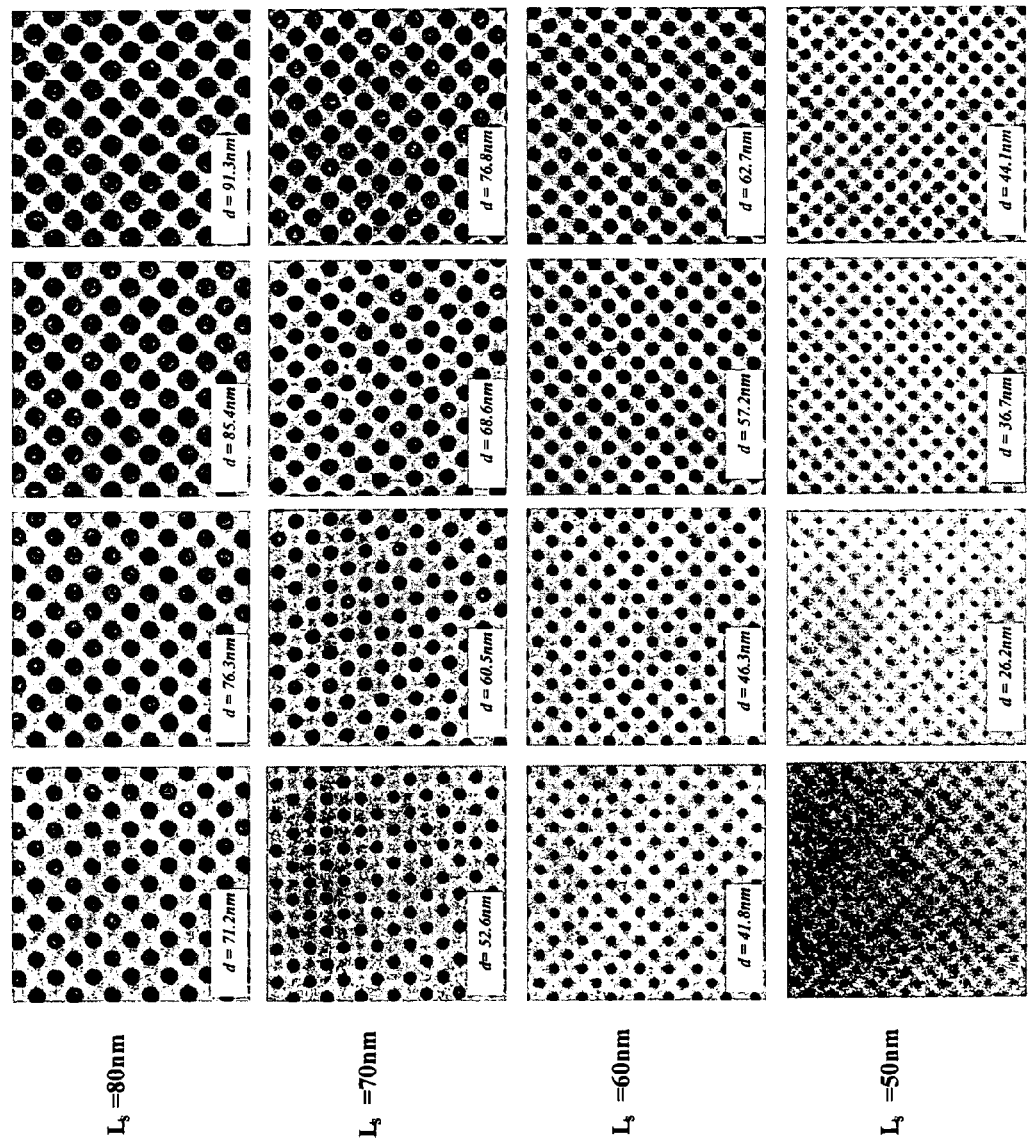
FIG. 12 provides SEM images of photoresist on a substrate that has been patterned with square arrays of spots having various length scales and spot diameters.
Figure 13:
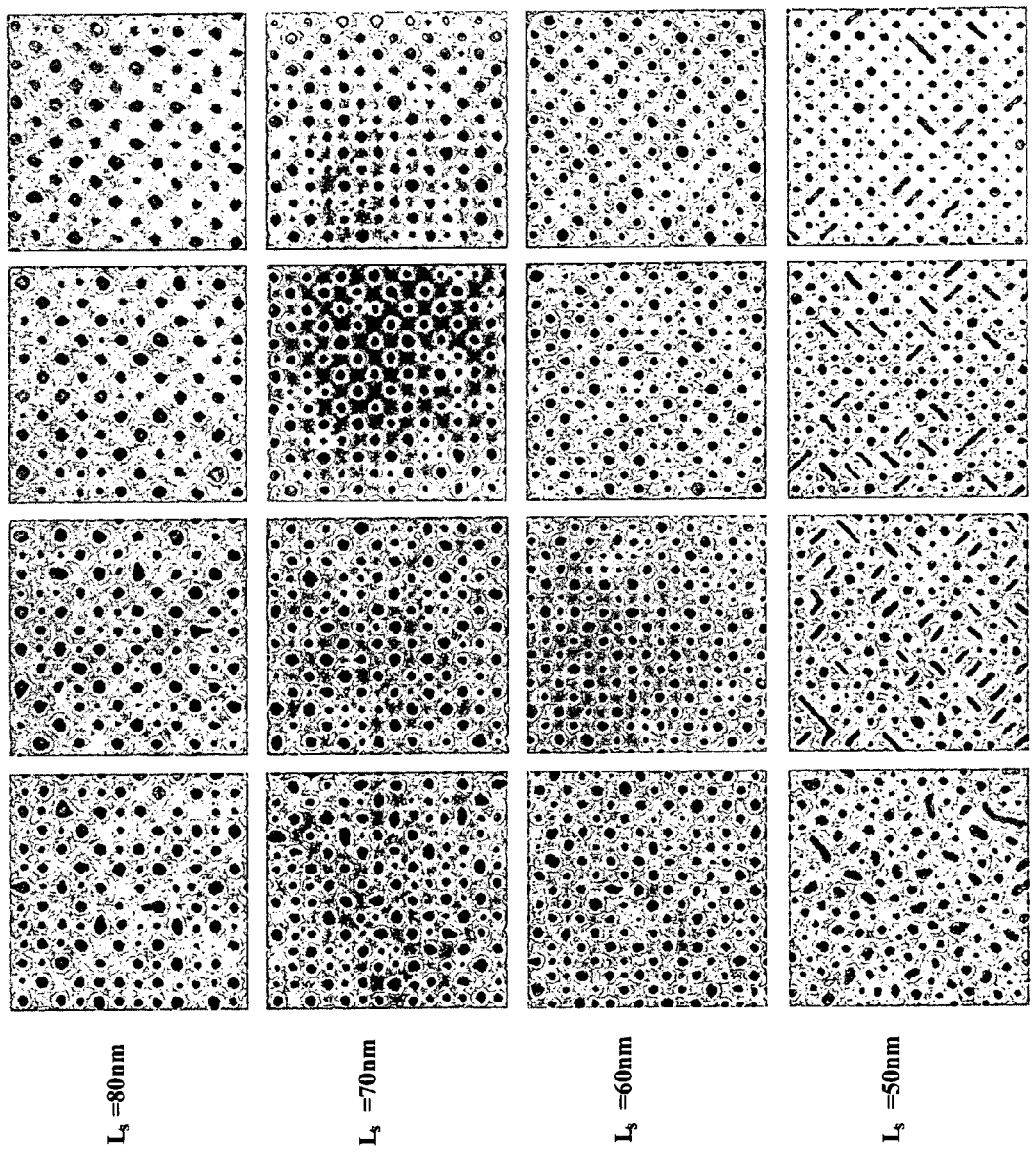
FIG. 13 provides SEM images of the films formed by depositing a cylinder-forming PS-b-PMMA material on patterns that were created using the substrates shown in FIG. 12.

Substrates were patterned with square arrays of PMMA-preferential wetting spots as generally described above. FIG. 12 shows SEM images of the patterned substrates for various $L_s$ (center-to-center distance of nearest neighbors) and spot diameters, d. A PS-b-PMMA copolymer material that forms hexagonally-arrayed cylinders of PMMA in a matrix of PS in the bulk was deposited on the patterned substrates shown in FIG. 12 to form films 22 nm thick. SEM images of the films are shown in FIG. 13. The diameter of the cylinders in the bulk is app~45 nm and the intercylinder distance is ~88 nm. The dark spots on the images indicate PMMA.

Figure 14B:
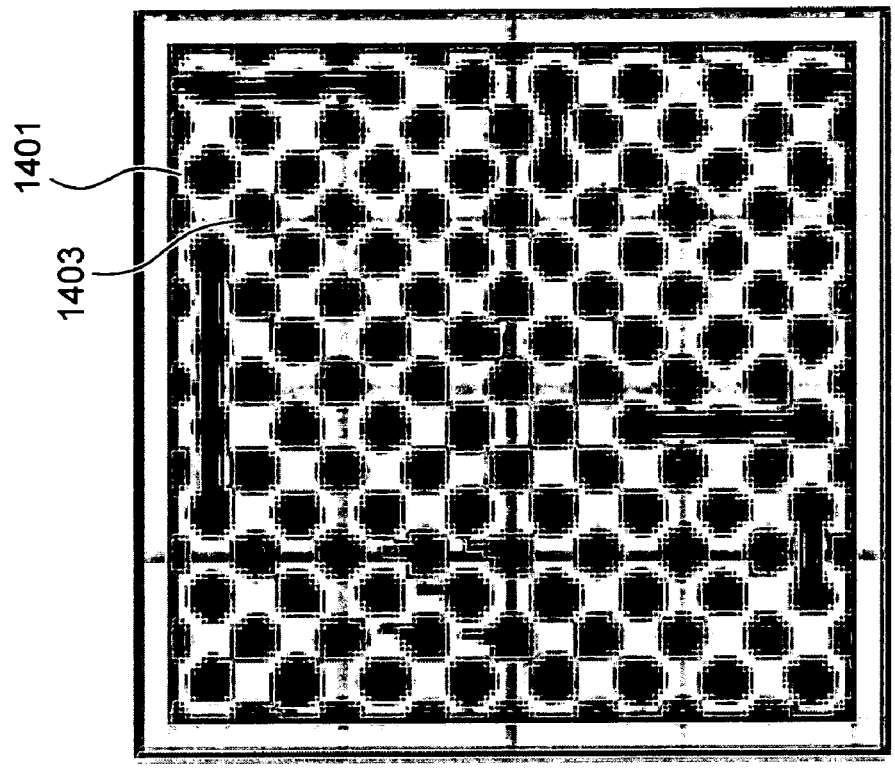
FIG. 14B provides the image of FIG. 14A with PS is removed from the image. The images show the PMMA and PS/PMMA interface portions of the film and the substrate.
Figure 14A:
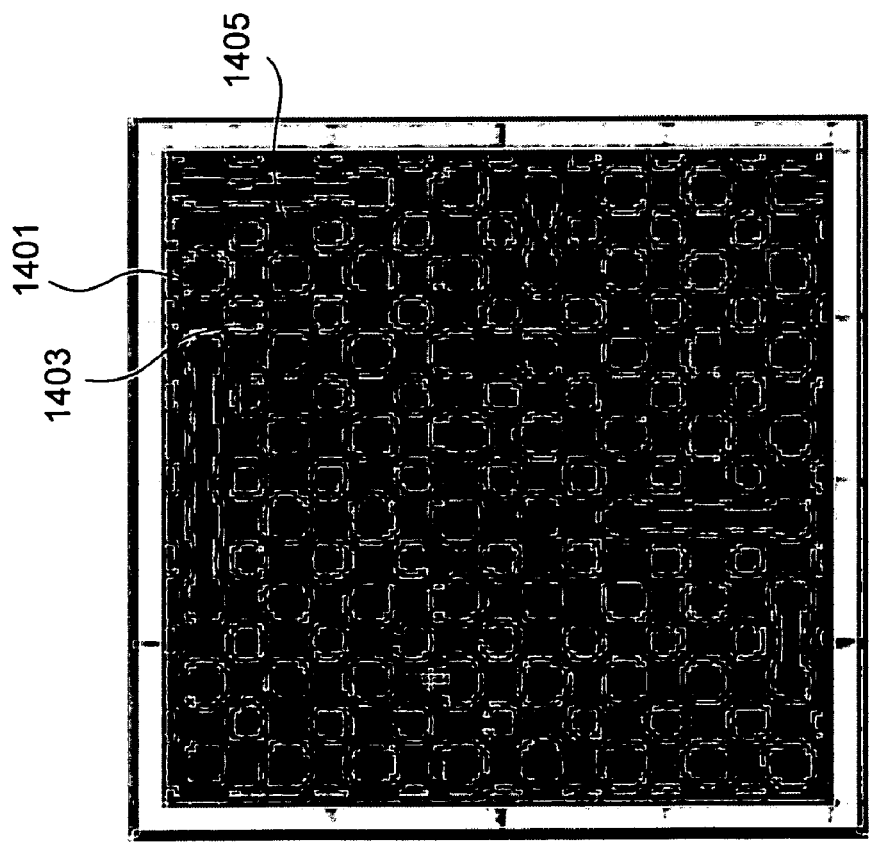
FIG. 14A provides a top view of a film formed by depositing a cylinder-forming PS-b-PMMA material on a square array of spots generated from a SCMF simulation.

FIG. 14A shows a top down image resulting from a SCMF simulation of the cylinder-forming PS-b-PMMA copolymer deposited on a square array. The dark spots indicate PMMA; the grey area PS; and the white areas the interface between PS and PMMA. The PMMA includes large spots 1401, as well as smaller spots 1403; the PS fills the area around the spots of PMMA, as indicated by reference number 1405. FIG. 14B shows the image with the PS removed from the image. For reference, FIG. 5B shows a schematic showing the patterned substrate (the spots 501 indicating PMMA-preferential wetting and the area 503 indicating PS-preferential wetting.)

As can be seen by comparing FIGS. 14B and 5B, large spots 1401 of PMMA align with the underlying chemical pattern; as would be expected for cases in which the copolymer material matched the substrate. Small spots 1403 however, do not correspond to the underlying pattern; rather they are formed spontaneously. These small spots add an additional degree of complexity to the thin film. Although, these small spots do not correspond to anything on the substrate pattern, they may be present at the substrate, or form at intermediate distance. Although this separated phase does not correspond to patterned region at the substrate, it is addressable as one knows the exact location of the small spots (i.e., the middle of any square whose corners are defined by the spots of the substrate pattern). At the surface, there are instances in which an interstitial cylinder appears to form, in which the large spots are beginning to grow together.

Figure 15B:
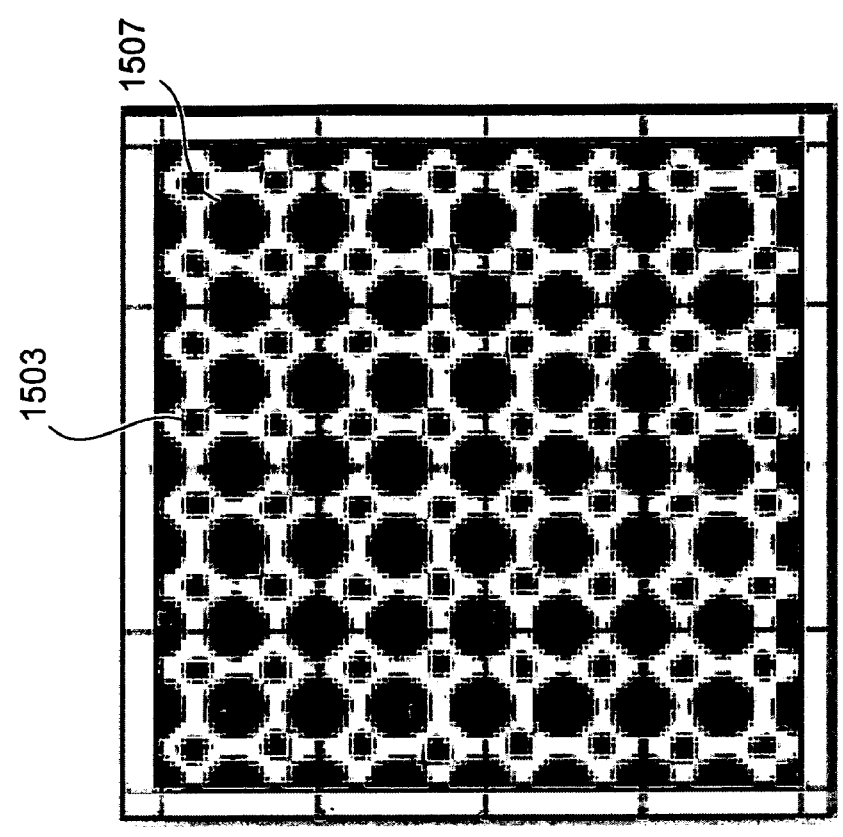
FIG. 15B provides the image of FIG. 14A with PS is removed from the image. The images show the PMMA and PS/PMMA interface portions of the film and the substrate.
Figure 15A:
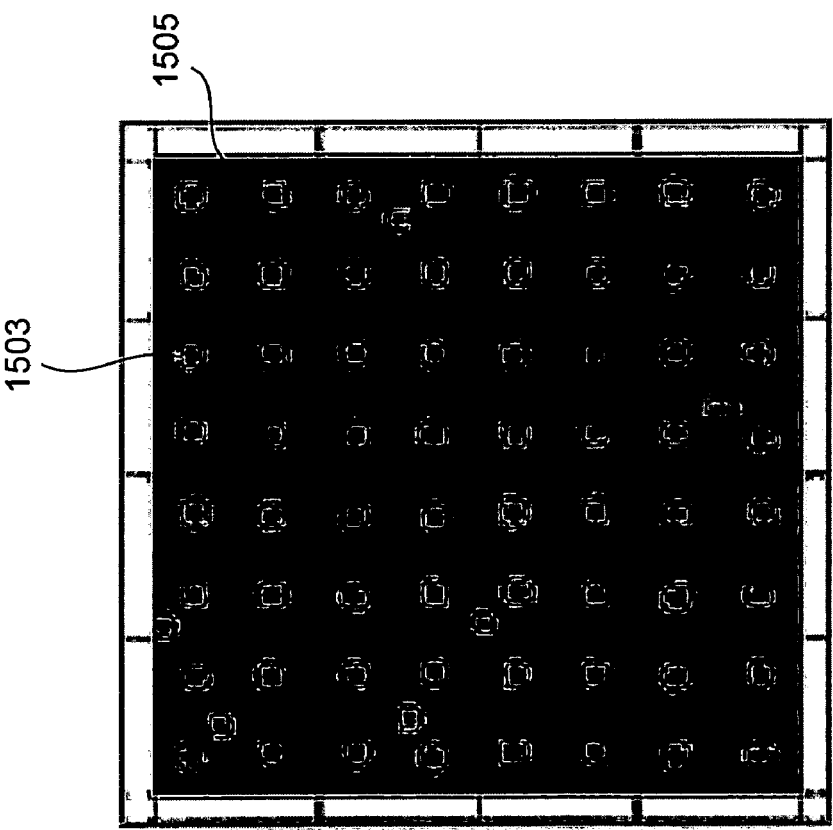
FIG. 15A provides a top view of a film formed by depositing a cylinder-forming PS-b-PMMA material on a square array of spots generated from a SCMF simulation.

FIGS. 15A and 15B shows the images resulting from a simulation of the cylinder-forming PS-b-PMMA copolymer deposited on a different square array. The square array used to generate these figures had a spot diameter of about 20 nm larger than that used to generate FIGS. 14A and 14B. The top of the film is a square array of small PMMA spots 1503 in a matrix 1505 of PS. FIG. 15B shows the image without the PS. Large spots 1507 indicate areas of PS/PMMA interface, i.e., where the PS matrix covers the PMMA that has formed on the PMMA-wetting spots. Small PMMA spots 1503 do not correspond to the underlying substrate; as in the film depicted in FIGS. 14A and 14B, these add an additional degree of complexity to the film.

Figure 18:
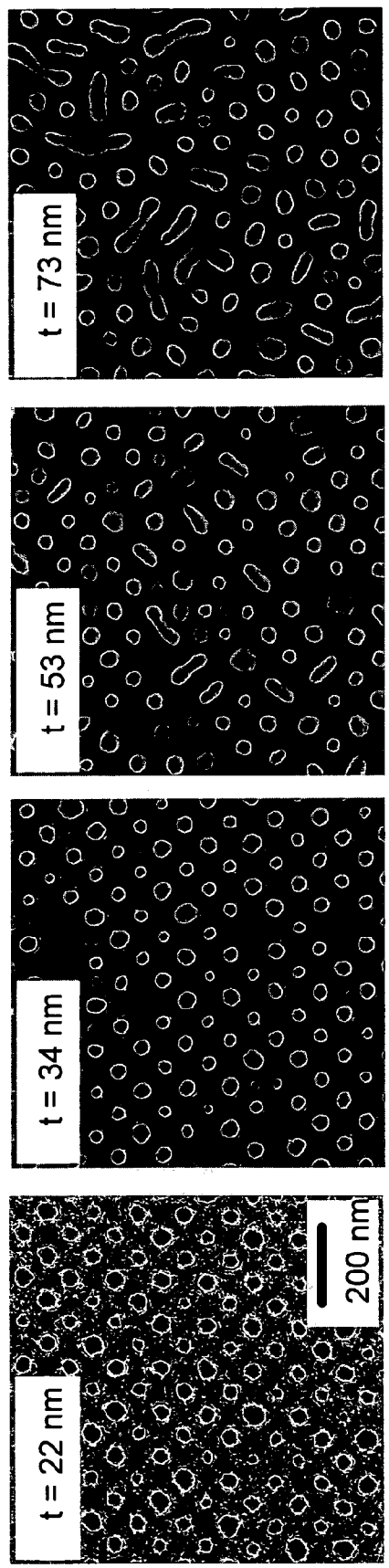
FIG. 18 shows SEM images of films of various thicknesses formed by SEM images of the films formed by depositing a cylinder-forming PS-b-PMMA material on chemically patterned with a square array of spots.

As discussed above, films return to their bulk morphology at increasing thicknesses. Cylinder-forming PS-b-PMMA copolymer deposited on a square array was deposited on a square array of spots pattern. FIG. 18 shows the surface of films of thicknesses of 22, 34, 53 and 73 nm. As can be seen from FIG. 18, as the thickness increases the film begins to exhibit its bulk morphology.

Example 6

Spherical PS-b-PMMA deposited on a chemically patterned substrates patterned by a square array of spots. In the bulk, the copolymer forms a hexagonal array of spheres of PMMA in a matrix of PS. In the bulk, the spheres are 20 nm in diameter with nearest neighbor distance of ~66 nm.

Figure 16:
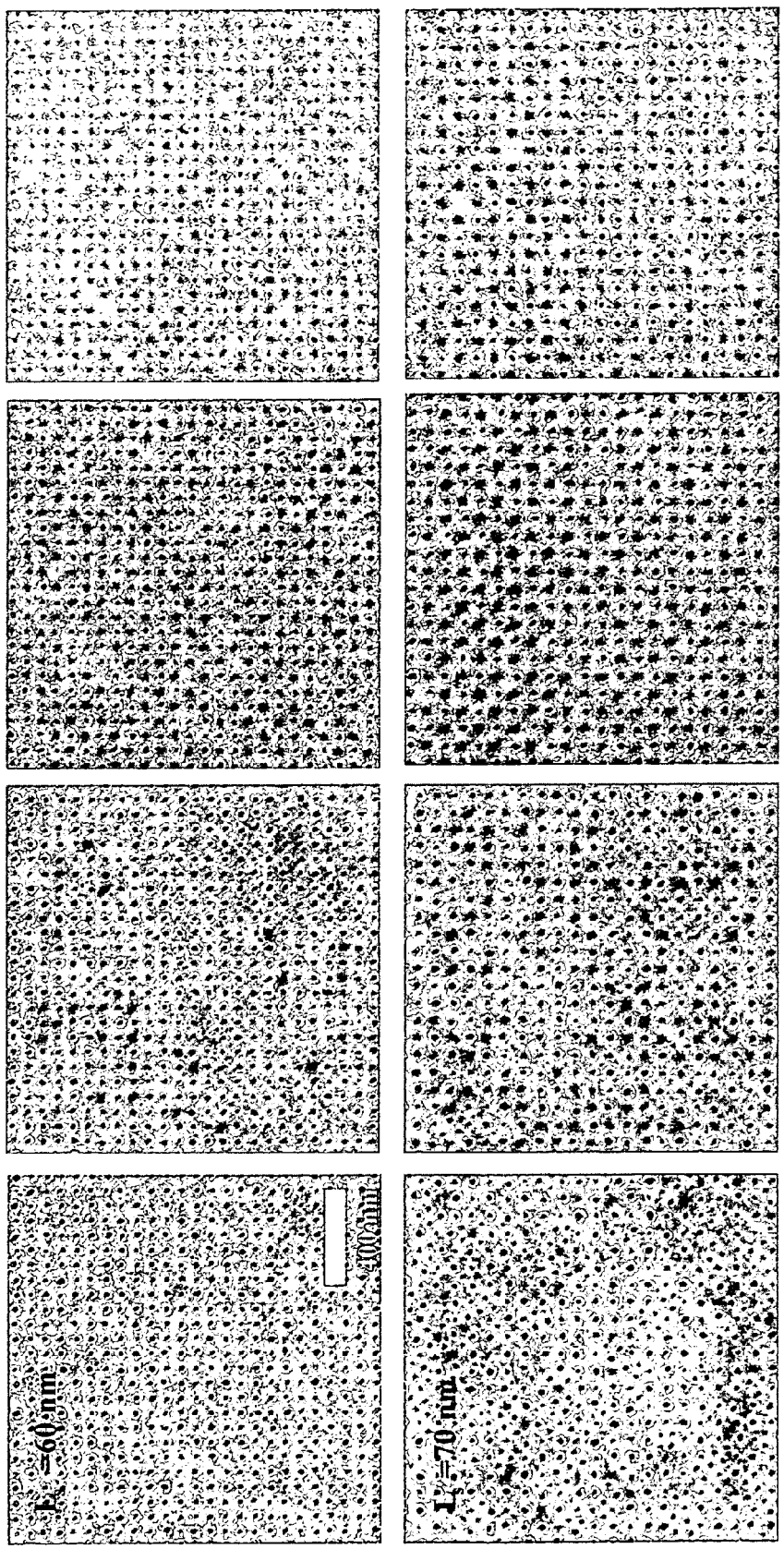
FIG. 16 provides SEM images of the films formed by depositing a sphere-forming PS-b-PMMA material on the substrates having length scales of 60 and 70 nm. Spot diameters of the patterns are as shown in FIG. 12 for 60 and 70 nm.

FIG. 16 provides SEM images of the copolymer material deposited on substrate patterns of various sizes. $L_s$ of the upper row is 60 nm and $L_s$ of the lower row is 70 nm, with substrate pattern spot diameter increasing left to right. The pattern spot diameters for $L_s$=60 nm patterns were 41.8 nm, 46.3 nm, 57.2 nm and 62.7 nm. The pattern spots diameters for $L_s$=70 nm patterns were 52.6 nm, 60.6 nm, 68.1 nm and 76.8 nm.

FIG. 6, discussed above, provides an SEM image of the film deposited on a substrate of $L_s$=60 nm and a spot diameter d of 41.8 nm. Top down and cross-sectional views of a unit square of the film are shown adjacent to the SEM image.

Figure 17:
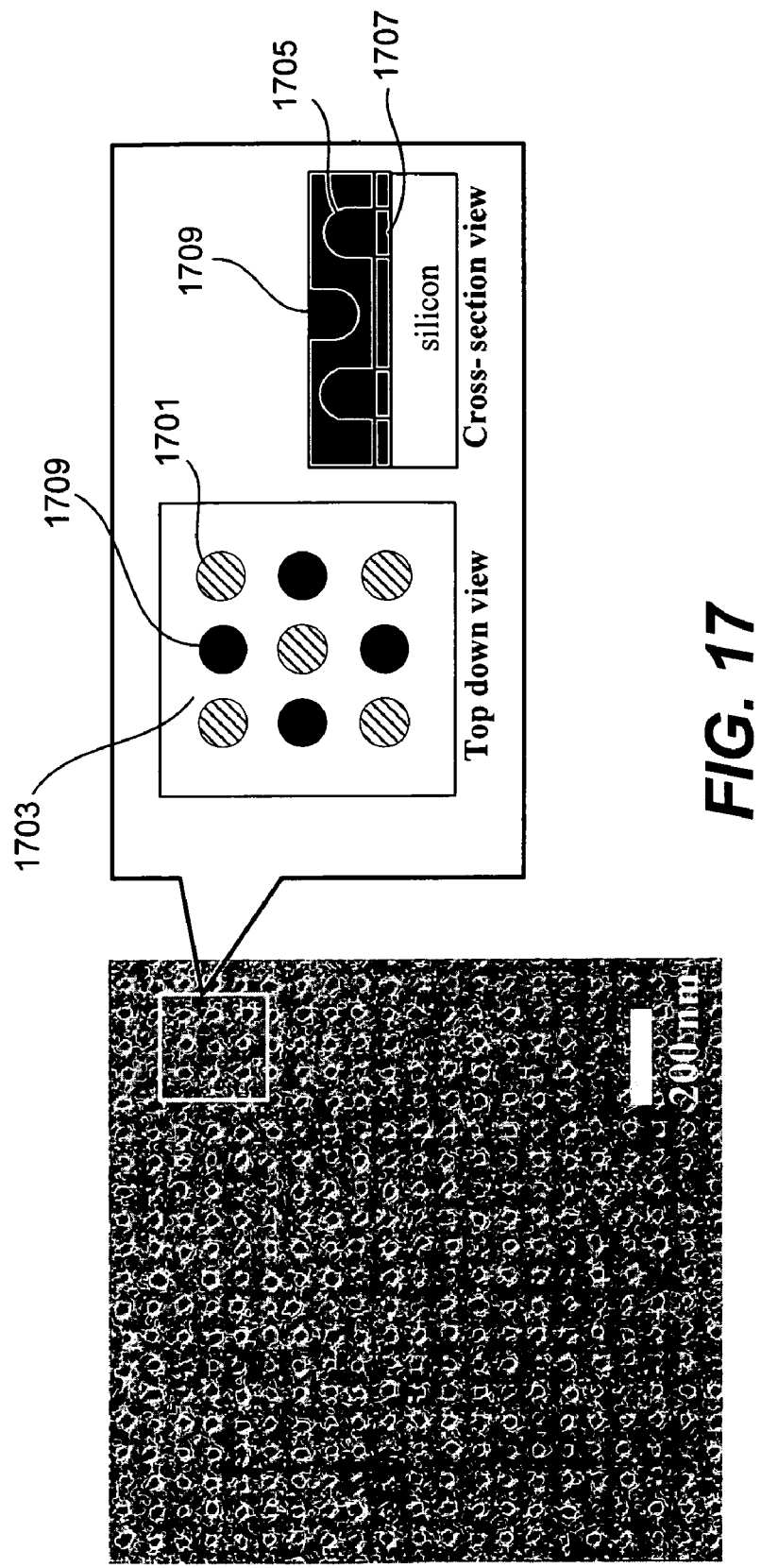
FIG. 17 shows an SEM image of spherical PS-b-PMMA deposited on a substrate chemically patterned with a square array of spots having $L_S$ of 60 nm. Schematics of the top and cross-sectional views of the film are also shown.

FIG. 17 provides an enlarged SEM image of the film deposited on a substrate $L_s$=80 nm and a spot diameter d of 91.3 nm. Top down and cross-sectional views of a unit square of the film are shown adjacent to the SEM image. The grey areas in the schematic indicate PS, the dark areas PMMA and the striped areas indicate the interface between PS and PMMA. Thus, the spots 1701 (interface) correspond to PMMA over the PMMA wetting spots on the patterned substrate, covered with PS. Black spots 1709 are PMMA (these are shown as the small black spots in the SEM image) in a PS matrix 1703. As seen in the cross-sectional view, the PS matrix 1703 and PMMA spot 1705 on wetting spot 1707 (the interface is not shown in the cross-sectional view). As is shown in the cross-sectional view, only some of the PMMA spots correspond to the underlying substrate. The buried spots are seen only at the substrate, while the other spots may be repeated in a direction perpendicular to the substrate in thicker films. As film thickness increases, the morphology will revert to the bulk behavior.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

All references cited are incorporated herein by reference in their entirety and for all purposes.

What is claimed is:

1. A method of forming thin film complex copolymer structures, comprising:
   (a) providing a substrate patterned with regions that differ in chemical functionality; said pattern having a first symmetry;
   (b) depositing a layer of material comprising a block copolymer on the substrate, wherein the bulk morphology of the block copolymer has a second symmetry that differs from the first symmetry; and
   (c) ordering the copolymer material to form a copolymer structure, at least one phase of said structure registered with the underlying substrate pattern wherein (c) comprises ordering the material such that the copolymer structure has a morphology that differs from any bulk morphology of the block copolymer material.

2. The method of claim 1 wherein (c) comprises ordering the copolymer material such that the copolymer structure morphology at a region proximate to the top of the film differs from the copolymer structure morphology at a region proximate to the substrate.

3. The method of claim 1 further comprising selectively functionalizing at least one phase of the copolymer structure.

4. A thin film copolymer structure comprising:
   a) a substrate patterned with regions that differ in chemical functionality; and
   b) a copolymer film comprising a microphase-separated block copolymer material on the substrate; wherein at least one phase is registered with the underlying substrate pattern and further wherein the film has a morphology that differs from any bulk morphology of the block copolymer material.

5. The thin film copolymer structure of claim 4 wherein a bulk morphology of the block copolymer material is selected from the group consisting of lamellar, cylindrical and spherical morphologies.

6. The thin film copolymer structure of claim 4 wherein the block copolymer material comprises a diblock copolymer.

7. The thin film copolymer structure of claim 4 wherein the copolymer film exhibits a first morphology at a region proximate to the top of the film and a second morphology at a region proximate to the substrate, wherein said first and second morphologies differ, and at least one phase is registered with the underlying substrate pattern.

8. The thin film copolymer structure of claim 7 wherein the first morphology has a first symmetry and the second morphology has a second symmetry and wherein the first and second symmetries differ.

9. The thin film copolymer structure of claim 7 wherein the first morphology has a first characteristic length scale and the second morphology has a second characteristic length scale and wherein the first and second characteristic length scales differ.

10. The thin film copolymer structure of claim 4 wherein the copolymer film comprises a diblock copolymer and the film exhibits bi-continuous morphology.

11. The thin film copolymer structure of claim 4 wherein the copolymer film exhibits a quadratically perforated lamella (QPL) morphology at the substrate; said QPL exhibiting long range order and registration with the substrate.

12. The thin film copolymer structure of claim 4 wherein the morphology at the surface of the film exhibits short range order.

13. The thin film copolymer structure of claim 4 wherein the copolymer is an A-b-B block copolymer and the film comprises alternating A-rich and B-rich perforated sheets.

14. The method of claim 1 wherein the block copolymer is a diblock copolymer.

15. The method claim 1 wherein a bulk morphology of the block copolymer is selected from the group consisting of lamellar, cylindrical and spherical morphologies.

16. The method of claim 2 wherein the copolymer structure morphology at a region proximate to the top of the film differs from the film morphology at a region proximate to the substrate in one or more of symmetry and characteristic length scale.

17. The thin film copolymer structure of claim 4, wherein the film morphology differs from the bulk morphology in length scale.

18. The thin film copolymer structure of claim 4, wherein the film morphology differs from the bulk morphology in symmetry.

* * * * *